(12) United States Patent
Gopinath et al.

(10) Patent No.: US 12,125,530 B2
(45) Date of Patent: *Oct. 22, 2024

(54) PARTITIONED MEMORY ARCHITECTURE WITH SINGLE RESISTOR OR DUAL RESISTOR MEMORY ELEMENTS FOR IN-MEMORY PIPELINE PROCESSING

(71) Applicant: GlobalFoundries U.S. Inc., Malta, NY (US)

(72) Inventors: Venkatesh P. Gopinath, Fremont, CA (US); Pirooz Parvarandeh, Los Altos Hills, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 154 days.

This patent is subject to a terminal disclaimer.

(21) Appl. No.: 18/045,524

(22) Filed: Oct. 11, 2022

(65) Prior Publication Data

US 2024/0120001 A1    Apr. 11, 2024

(51) Int. Cl.
| | | |
|---|---|---|
| G11C 13/00 | (2006.01) | |
| G11C 11/16 | (2006.01) | |
| G11C 27/02 | (2006.01) | |

(52) U.S. Cl.
CPC ...... *G11C 13/0026* (2013.01); *G11C 11/1655* (2013.01); *G11C 13/0004* (2013.01); *G11C 13/0038* (2013.01); *G11C 27/02* (2013.01)

(58) Field of Classification Search
CPC ............ G11C 13/0026; G11C 11/1655; G11C 13/0004; G11C 13/0038; G11C 27/02;
(Continued)

(56) References Cited

U.S. PATENT DOCUMENTS

| 4,906,865 A | 3/1990 | Holler |
|---|---|---|
| 7,830,705 B2 | 11/2010 | Jeong |

(Continued)

FOREIGN PATENT DOCUMENTS

| CN | 113139641 A | 7/2021 | |
|---|---|---|---|
| DE | 102020126502 A1 * | 5/2021 | ......... G11C 13/0026 |

(Continued)

OTHER PUBLICATIONS

U.S. Appl. No. 18/045,529, all pages. (filed 2022).*
(Continued)

*Primary Examiner* — Fernando Hidalgo
(74) *Attorney, Agent, or Firm* — David Cain; Hoffman Warnick LLC

(57) ABSTRACT

A structure for in-memory pipeline processing includes a memory bank array. Each bank includes single resistor or dual resistor memory elements connected between input nodes, respectively, and bitline(s) (e.g., a single bitline for a single resistor memory element and first and second bitlines for a dual resistor memory element). A feedback buffer is connected to each bitline and a corresponding output node in each bank and a column interconnect line connects corresponding output nodes of all banks in the same column. The initial bank in each row includes amplifiers connected between the input nodes and memory elements and track-and-hold devices (THs) connected to the input nodes to facilitate pipeline processing. Outputs of the amplifiers are also connected by row interconnect lines to memory elements in downstream banks in the same row. Optionally, voltage buffers are connected to row interconnect lines and integrated into at least some banks.

20 Claims, 19 Drawing Sheets

(58) Field of Classification Search
CPC ....... G11C 7/1039; G11C 27/026; G11C 7/12; G11C 13/0028; G11C 2213/77; G11C 7/1006; G11C 7/1084; G11C 11/56; G11C 13/003; G11C 13/004; G11C 11/54; G06F 2207/4814; G06F 7/5443; G06N 3/065
USPC ....................................................... 365/148
See application file for complete search history.

(56) References Cited

U.S. PATENT DOCUMENTS

| | | |
|---|---|---|
| 9,450,021 B1 | 9/2016 | Lee |
| 9,934,838 B1 | 4/2018 | Han et al. |
| 10,290,679 B1 | 5/2019 | Bhushan et al. |
| 11,335,401 B1 | 5/2022 | Huang et al. |
| 2006/0126413 A1 | 6/2006 | Liaw |
| 2014/0050020 A1 | 2/2014 | Lee et al. |
| 2014/0169068 A1 | 6/2014 | Lee et al. |
| 2016/0027488 A1 | 1/2016 | Kim |
| 2016/0372187 A1 | 12/2016 | Papandreou et al. |
| 2018/0260696 A1 | 9/2018 | Suda et al. |
| 2018/0268898 A1 | 9/2018 | Suzuki et al. |
| 2019/0147330 A1 | 5/2019 | Otsuka et al. |
| 2019/0236445 A1 | 8/2019 | Das et al. |
| 2019/0392896 A1* | 12/2019 | Chung ............... G11C 13/0026 |
| 2020/0356848 A1 | 11/2020 | Lesso et al. |
| 2021/0064379 A1 | 3/2021 | Mattina et al. |
| 2021/0263683 A1 | 8/2021 | Bayat et al. |
| 2023/0066707 A1* | 3/2023 | Chuang ............... G11C 13/0002 |
| 2023/0326524 A1 | 10/2023 | Pasotti et al. |
| 2023/0326525 A1* | 10/2023 | Akarvardar .......... G11C 13/003 365/230.03 |
| 2024/0038300 A1* | 2/2024 | Kumar ................. G11C 29/028 |

FOREIGN PATENT DOCUMENTS

| | | | | |
|---|---|---|---|---|
| WO | WO-2018069716 A1 * | 4/2018 | ......... | G11C 13/0002 |
| WO | 2020243300 A1 | 12/2020 | | |

OTHER PUBLICATIONS

U.S. Appl. No. 18/045,545, all pages. (filed 2022).*
Aziza et al., "Multi-Level Control of Resistive RAM (RRAM) Using a Write Termination to Achieve 4 Bits/Cell in High Resistance State," Electronics 2021, 10, 2222, 15 pages.
Dong et al., "Design Considerations of Large-Scale RRAM-Based Convolutional Neural Networks with Transfer Learning," retrieved from https://www.researchgate.net/publication/343982199, uploaded Aug. 30, 2020, 7 pages.
Fick et al., "Analog In-Memory Subthreshold Deep Neural Network Accelerator," IEEE 2017, 4 pages.
Giannoula et al., "SparseP: Towards Efficient Sparse Matrix Vector Multiplication on Real Processing-In-Memory Systems," arXiv:2201.05072v4 [cs.AR], May 23, 2022, 60 pages.
Gu et al., "Techniligocal Exploration of RRAM Crossbar Array for Matrix-Vector Multiplication," IEEE 2015, pp. 106-111.
Jaiswal et al., "8T SRAM Cell as a Multi-bit Dot Product Engine for Beyond von-Neumann Computing," IEEE Oct. 16, 2018, 10 pages.
Qiao et al., "AtomLayer: A universal ReRAM-based CNN accelerator with atomic layer computation," In Proceedings of the 55th Annual Design Automation Conference 6 pages.
Sahay et al., A 2T-1R Cell Array with High Dynamic Range for Mismatch-Robust and Efficient Neurocomputing, IEEE 2020, 4 pages.
Shafiee et al., "ISAAC: A convolutional neural network accelerator with in-situ analog arithmetic in crossbars," ACM SIGARCH Computer Architecture News, 44(3), pp. 14-26.
Stathopoulos et al., "Multibit memory operation of metal oxide bi-layer memristors," Scientific Reports 7.1 (2017), 7 pages.
Xue et al., "Embedded 1-Mb ReRAM-Based Computing-in-Memory Macro With Multibit Input and weight for CNN-Baed AI Edge Processors," IEEE Journal of Solid-State Circuits, vol. 55, No. 1, Jan. 2020, pp. 203-215.
Yao et al., "Fully hardware-implemented memristor convolutional neural network," Nature, vol. 577, Jan. 30, 2020, pp. 641-662.
Yin et al., "Monolithically Integrated RRAM-and CMOS-Based In-Memory Computing Optimizations for Efficient Deep Learning," IEEE Mirco 2019, pp. 54-63.
Correll et al., "A Fully Integrated Reprogrammable CMOS-RRAM Compute-in-Memory Coprocessor for Neuromorphic Applications," IEEE Journal on Exploratory Solid-State Computational Devices and Circuits, published May 4, 2020, pp. 36-44.
European Search Report for EP Application No. 23187989.1-1211 dated Mar. 5, 2024, 9 pages, (corresponding to U.S. Appl. No. 18/045,545).
Chang et al., "AI hardware acceleration with analog memory: Microarchitectures for low energy at high speed," IBM J. Res. & Dev. vol. 63, No. 6, Paper 8, Nov./Dec. 2019, 14 pages.
European Search Report for EP Application No. 23187147.6-1211 dated Mar. 6, 2024, 11 pages, (corresponding to U.S. Appl. No. 18/045,524).
European Search Report for EP Application No. 23187993.3-1211 dated Mar. 13, 2024, 9 pages, (corresponding to U.S. Appl. No. 18/045,479).
U.S. Appl. No. 18/045,545, Office Action dated Jun. 21, 2024, (GFPR-0012-US5), 23 pages.
U.S. Appl. No. 18/045,520, Office Action dated Jul. 22, 2024, 13 pages.
U.S. Appl. No. 18/045,545, Response to Office Action filed Jul. 15, 2024, 17 pages.
EP Patent Application Serial No. 23187997.4-1211, Search Report dated Jul. 24, 2024, 9 pages.
U.S. Appl. No. 18/045,479, Notice of Allowance dated Jun. 28, 2024, 28 pages.
U.S. Appl. No. 18/045,529, Notice of Allowance dated Jul. 31, 2024, 12 pages.

* cited by examiner

FIG. 8

TIMING DIAGRAM FOR PIPELINE PROCESSING

| | | Time | 1 | 2 | 3 | 4 | 5 | 6 | 7 | 8 | 9 | 10 | 11 | 12 | 13 |
|---|---|---|---|---|---|---|---|---|---|---|---|---|---|---|---|
| Sample 1 | Layer 1 | Sample all activations voltages | X | | | | | | | | | | | | |
| | Layer 1 | Allow settling time for the virtual ground buffer | | X | | | | | | | | | | | |
| | Layer 1 | Activate the data processing element function | | | X | | | | | | | | | | |
| | Layer 1 | Provide the output to the next layer | | | | X | | | | | | | | | |
| Sample 1 | Layer 2 | Sample all activations voltages | | | | X | | | | | | | | | |
| | Layer 2 | Allow settling time for the virtual ground buffer | | | | | X | | | | | | | | |
| | Layer 2 | Activate the data processing element function | | | | | | X | | | | | | | |
| | Layer 2 | Provide the output to the next layer | | | | | | | X | | | | | | |
| Sample 1 | Layer 3 | Sample all activations voltages | | | | | | | X | | | | | | |
| | Layer 3 | Allow settling time for the virtual ground buffer | | | | | | | | X | | | | | |
| | Layer 3 | Activate the data processing element function | | | | | | | | | X | | | | |
| | Layer 3 | Provide the output to the next layer | | | | | | | | | | X | | | |
| Sample 2 | Layer 1 | Sample all activations voltages | | | | X | | | | | | | | | |
| | Layer 1 | Allow settling time for the virtual ground buffer | | | | | X | | | | | | | | |
| | Layer 1 | Activate the data processing element function | | | | | | X | | | | | | | |
| | Layer 1 | Provide the output to the next layer | | | | | | | X | | | | | | |
| Sample 2 | Layer 2 | Sample all activations voltages | | | | | | | X | | | | | | |
| | Layer 2 | Allow settling time for the virtual ground buffer | | | | | | | | X | | | | | |
| | Layer 2 | Activate the data processing element function | | | | | | | | | X | | | | |
| | Layer 2 | Provide the output to the next layer | | | | | | | | | | X | | | |
| Sample 2 | Layer 3 | Sample all activations voltages | | | | | | | | | | X | | | |
| | Layer 3 | Allow settling time for the virtual ground buffer | | | | | | | | | | | X | | |
| | Layer 3 | Activate the data processing element function | | | | | | | | | | | | X | |
| | Layer 3 | Provide the output to the next layer | | | | | | | | | | | | | X |

PARTITIONED MEMORY ARCHITECTURE WITH SINGLE RESISTOR OR DUAL RESISTOR MEMORY ELEMENTS FOR IN-MEMORY PIPELINE PROCESSING

BACKGROUND

Field of the Invention

The present invention relates to in-memory processing and, more particularly, to embodiments of a memory architecture for in-memory processing.

Description of Related Art

Various processing applications (e.g., image processing applications, voice processing applications, or other machine learning (ML) or artificial intelligence (AI) processing) employ cognitive computing and, particularly, neural networks (NNs) (e.g., for recognition and classification). Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. Recently, processors with hardware-implemented NN's and, particularly, with memory-implemented NN's have been developed to increase processing speed. However, such memory implemented NNs typically require large memory cell arrays (i.e., arrays with a large number of rows and columns of memory cells) to implement and, as the complexity of such NNs increases, so does the size of the arrays. Unfortunately, such an increase in array size can result in an increase in local voltage ("IR") drops, thereby leading to processing errors.

SUMMARY

Generally, embodiments of the structure disclosed herein can include an array of memory banks arranged in rows and columns. The memory banks can be arranged in rows and columns. Each memory bank can include input nodes. Each memory bank can further include a bitline. Each memory bank can further include memory elements connected to the input node, respectively, and each memory element can include a programmable resistor connected between a corresponding input node and the bitline. Each memory bank can further include a feedback buffer circuit connected to the bitline. Additionally, each row of the memory banks can include an initial memory bank (i.e., the first bank in the row) and each initial memory bank can include amplifiers connected between the input nodes and the memory elements and track-and-hold devices (THs) connected to the input nodes.

Some embodiments of the structure disclosed herein can specifically include array of memory banks with single resistor memory elements. That is, the structure can include an array of memory banks arranged in rows and columns. Each memory bank can include multiple input nodes, a single output node, and a single bitline. Each memory bank can further include multiple memory elements connected to the input nodes, respectively. Specifically, each memory element can include a single programmable resistor, which is connected between a corresponding input node and the bitline. Each memory bank can further include a feedback buffer circuit connected to a bias node at one end of the bitline and also to the output node. Additionally, each row of the memory banks can include an initial memory bank (i.e., the first bank in the row) and at least one additional memory bank downstream of the initial memory bank. Each initial memory bank can include amplifiers connected between the input nodes and the memory elements and THs connected to the input nodes.

Other embodiment of the structure disclosed herein can include an array of memory banks with dual resistor memory elements. That is, the structure can include an array of memory banks arranged in rows and columns. Each memory bank can include multiple input nodes, two output nodes (i.e., a first output node and a second output node) and two bitlines (i.e., a first bitline and a second bitline). Each memory bank can further include multiple dual resistor memory elements connected to the input nodes, respectively. Each dual resistor memory element can include two programmable resistors (i.e., a first programmable resistor and a second programmable resistor). The first programmable resistor can be connected between a corresponding input node and the first bitline. The second programmable resistor can be connected between the same corresponding input node and the second bitline. Each memory back can further include two feedback buffer circuits (i.e., a first feedback buffer circuit and a second feedback buffer circuit). The first feedback buffer circuit can be connected to a first bias node at one end of the first bitline and to the first output node. The second feedback buffer circuit can be connected to a second bias node at one end of the second bitline and to the second output node. Additionally, each row of the memory banks can include an initial memory bank (i.e., a first memory bank in the row) and at least one additional memory bank downstream of the additional memory bank. Each initial memory bank can include amplifiers connected between the input nodes and the memory elements and THs connected to the input nodes.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 8 is an example of a timing diagram for in-memory pipeline processing using the disclosed structure;

FIGS. 10A-19A are schematic diagrams illustrating different additional components that could be incorporated into the disclosed structure o implement different writing schemes, respectively, for programming resistors;

FIGS. 10B-19B are corresponding conductance-to-pulse diagrams associated with FIGS. 10A-19B, respectively;

DETAILED DESCRIPTION

As mentioned above, oftentimes, in a deep neural network designed, for example, for image processing, for audio processing, or for some ML or AI processing, the array of memory cells will need to be quite large. Unfortunately, such an increase in array size can result in an increase in local voltage ("IR") drops, thereby leading to processing errors.

In view of the foregoing, disclosed herein are embodiments of a structure including a partitioned memory architecture, which has single resistor elements or multi-resistor memory elements (e.g., dual resistor memory elements) and which is configured for in-memory processing, such as for in-memory matrix vector multiplication processing, including in-memory pipeline processing. Specifically, memory elements in the array can be partitioned into memory banks arranged in columns and rows. Each memory bank can include: memory elements; input nodes connected to the memory elements, respectively; and at least one output node. Each memory bank can further include feedback buffer circuit(s) connected to the output node(s), respectively. Each row of memory banks can include an initial memory bank (i.e., a first memory bank in the row and at least one additional downstream memory bank) and at least one additional memory bank downstream of the initial memory bank. Each initial memory bank can include amplifiers connected between the input nodes and the memory elements and track-and-hold devices (THs) connected to the input nodes. The THs enable pipeline processing as well as interruptions in normal operations (e.g., mid-stream) to preform maintenance operations (e.g., calibration, refreshment programming, etc.) without resulting in data loss. Optionally, one or more of the additional memory banks (i.e., downstream of the initial memory bank) can include voltage buffers connected between the input nodes and the memory elements. Each memory bank can further include feedback buffer circuit(s) at the output node(s). In this structure, the amplifiers, feedback buffer circuits, and optional voltage buffers minimize local IR drops.

Figure 1:
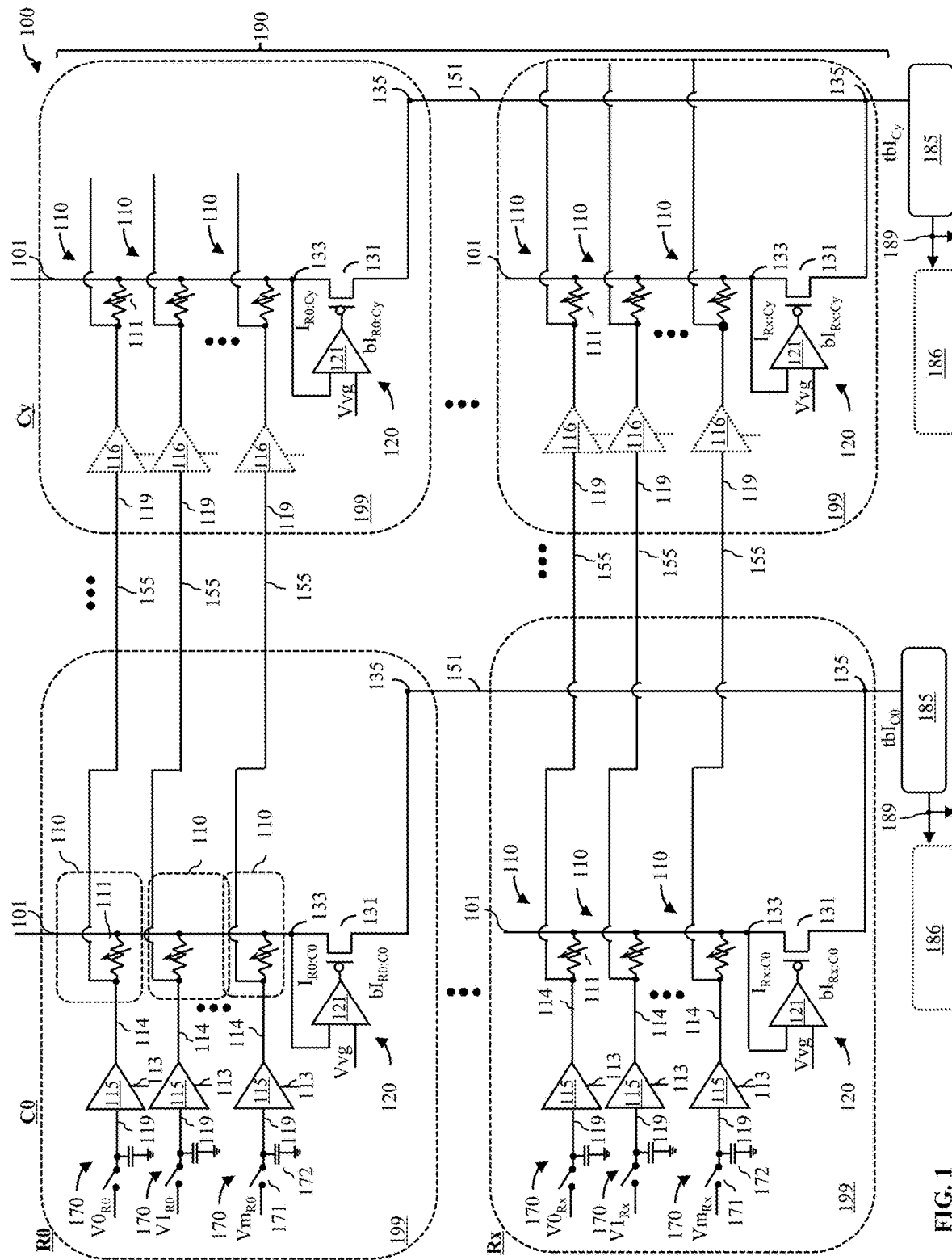
FIGS. 1 and 2 are schematic diagrams illustrating different embodiments of an in-memory processing structure.
Figure 2:
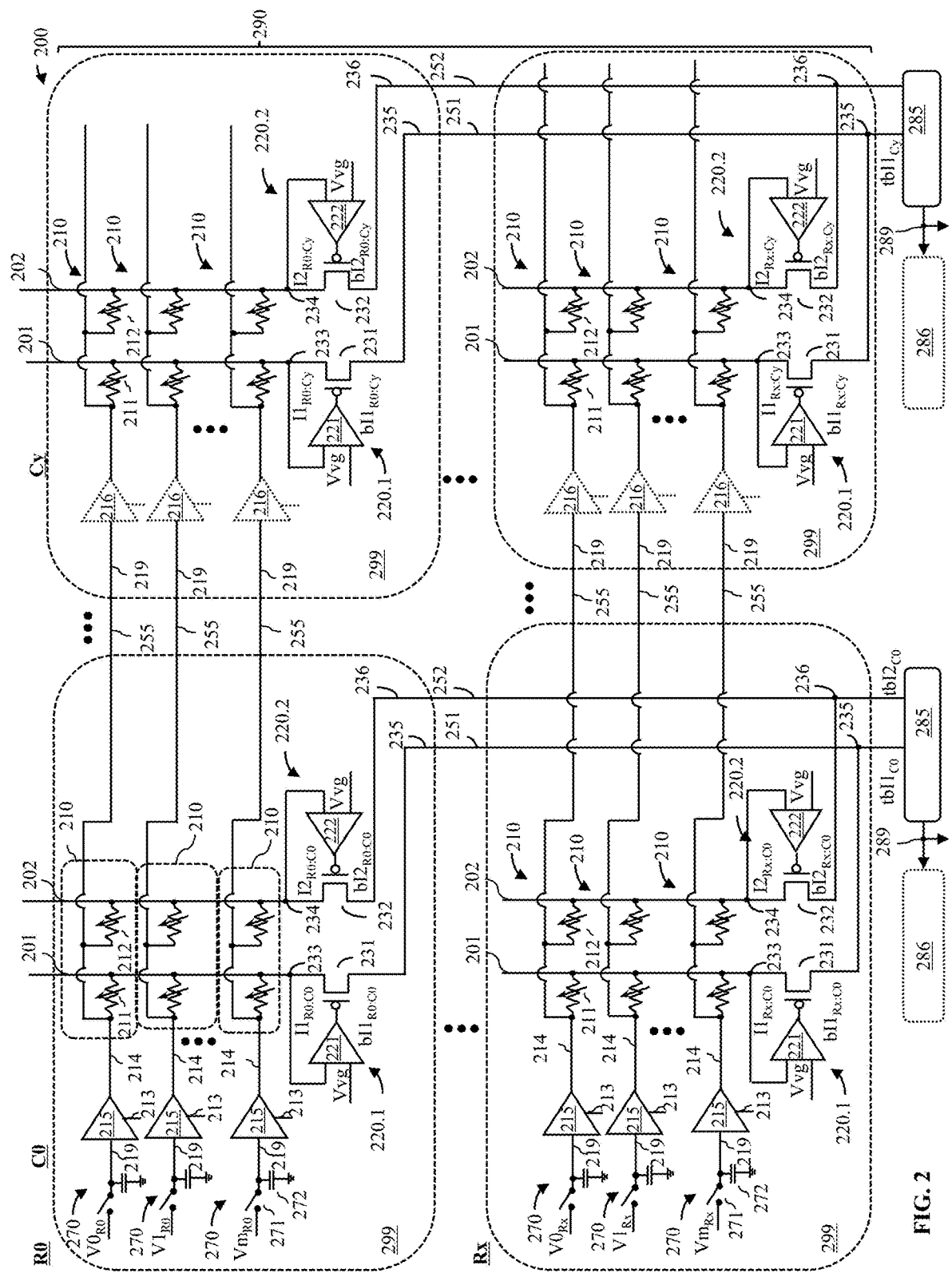
Figure 3A:
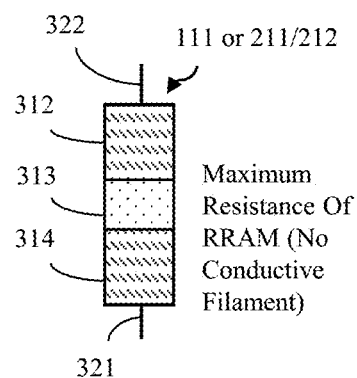
FIGS. 3A-3D are cross-section diagrams illustrating resistance states of a resistive random access memory (RRAM)-type programmable resistor that could be incorporated into the disclosed structure.
Figure 3B:
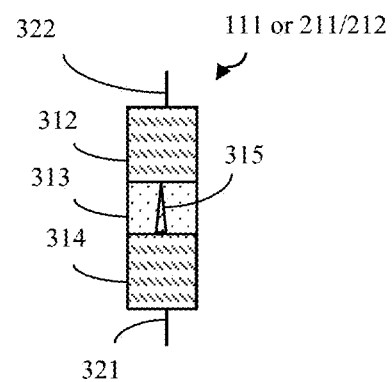
Figure 3C:
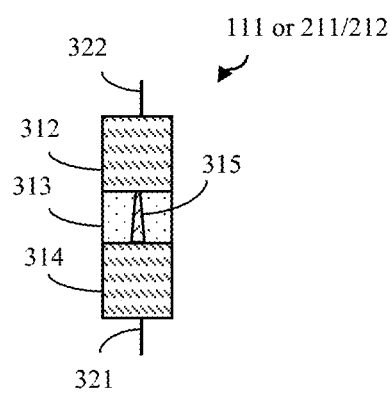
Figure 3D:
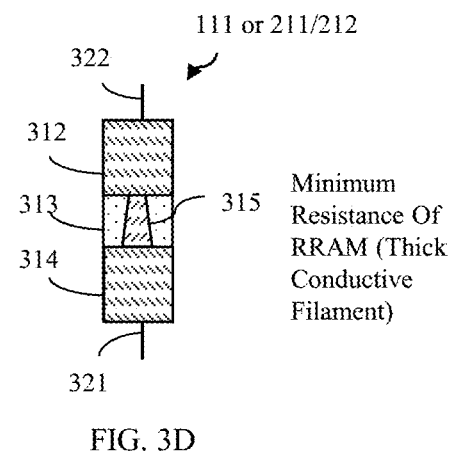

FIGS. 1 and 2 are schematic diagrams illustrating disclosed embodiments of a structure 100, 200, respectively, including a partitioned memory architecture configured for in-memory processing, such as for in-memory matrix vector multiplication processing, including in-memory pipeline processing due to the use of track-and-hold devices (THs) 170.

As illustrated in FIGS. 1 and 2, the structure 100, 200 can include a partitioned array of memory elements 110, 210. In the structure 100, the memory elements 110 are single resistor memory elements, whereas, in the structure 200, the memory elements are dual resistor memory elements. Specifically, in the structure 100 each memory element 110 can include a single programmable resistor 111 (also referred to herein as a variable resistor). In the structure 200, each memory element 210 can include two programmable resistors and, particularly, a first programmable resistor 211 and a second programmable resistor 212. The first and second programmable resistors 211-212 can be essentially the same (i.e., can have the same design, be the same type, be made of the same materials, etc.). In any case, in the memory element 110 of the structure 100 or the memory element 210 of the structure 200, each programmable resistor can be any type of resistor having controllable resistance and suitable for use as a non-volatile resistive memory element (i.e., a resistive memory element that retains its programmed resistance state even if/when the device loses power).

For example, each programmable resistor 111, 211-212 can be a resistive random access memory (RRAM)-type programmable resistor. Alternatively, each programmable resistor 111, 211-212 can be a phase change memory (PCM)-type programmable resistor, magnetic tunnel junction (MTJ)-type programmable resistor, or any other suitable type of programmable resistor configured so that, by applying specific bias conditions to one or both opposing end terminals of the resistor, the resistance of the programmable resistor can be changed between at least two different stable resistance states. For example, the resistance states of such a programmable resistor can be programmed to a maximum resistance state, to a minimum resistance state, and optionally to one or more resistance states along a continuum between the minimum and maximum resistance states. In some cases, the programmable resistors could have a significantly large number of different stable resistance states (e.g., 16 or more).

FIGS. 3A-3D illustrate an RRAM-type programmable resistor that could be employed in a memory element 110, 210 as the programmable resistor(s) 111, 211-212. An RRAM is typically a back end of the line (BEOL) multi-layered structure, which includes two metallic layers 312 and 314 separated by a dielectric region 313 (also referred to herein as a resistance switching region). Depending upon the specific materials used and on the biasing conditions applied to the opposing end terminals 321-322 of such a resistor during a write operation, metal ions migrate to: (a) grow conductive filament(s) 315 in the dielectric region 313 extending between the metallic layers 312 and 314 so that the resistance state of the RRAM-type programmable resistor decreases or (b) break down conductive filament(s) within the dielectric region 313 between the metallic layers 312 and 314 so that the resistance state of the RRAM-type programmable resistor increases. Those skilled in the art will recognize that the total number of stable resistance states achievable with such an RRAM-type programmable resistor can vary depending upon the materials used and the biasing conditions. An RRAM-type programmable resistor could include metallic layers 312-314 (e.g., of platinum (Pt), titanium (Ti), titanium nitride (TiN), etc.) and, between the metallic layers 212-214, a dielectric region 313 including an oxide layer, such as a tantalum oxide ($Ta_2O_5$) layer, a hafnium oxide ($HfO_2$) layer, an iron oxide ($Fe_2O_3$) layer, a titanium oxide (TiO2) layer, etc. However, the addition of one or more thin interface barrier layers (e.g., a second oxide layer, such as aluminum oxide (Al2O3) or some other oxide layer, an amorphous silicon layer, or some other suitable interface barrier layer) between the oxide layer and one or both metallic layers can improve the switching characteristics and increase the number of different detectable stable resistance states between a minimum resistance state and a maximum resistance state.

Figure 4A:
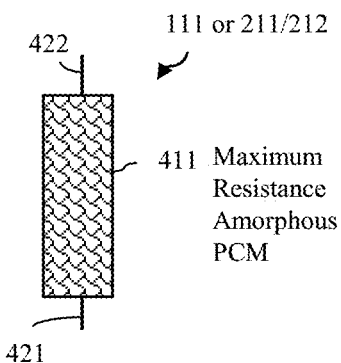
FIGS. 4A-4B are cross-section diagrams illustrating some resistance states of a phase change memory (PCM)-type programmable resistor that could be incorporated into the disclosed structure.
Figure 4B:
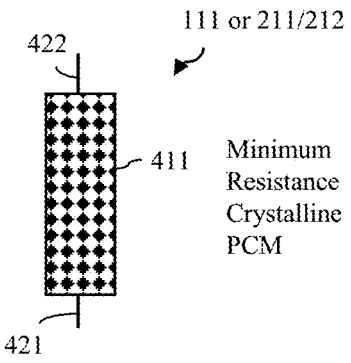

FIGS. 4A-4B illustrate a PCM-type programmable resistor that could be employed in a memory element 110, 210 as the programmable resistor(s) 111, 211-212. A PCM-type programmable resistor includes a phase change material 411 (e.g., a chalcogenide compound) with programmable structural phases that exhibit different stable resistance states. For example, in a fully amorphous phase, exemplified by the drawing shown in FIG. 4A, the resistor will have the maximum resistance, whereas in a fully crystalline phase, exemplified by the drawing shown in FIG. 4B, the resistor will have the minimum resistance. In any phase between the fully amorphous phase and the fully crystalline phase (i.e., a partially amorphous and partially crystalline structure) the resistor will have a resistance between the maximum and the minimum resistances. Phase changes are dependent upon the local temperature of the PCM, which is controlled by the length and strength of an applied voltage. For example, changing from a crystalline phase toward or to an amorphous phase can be achieved by applying a short high voltage pulse to one or both of the opposing end terminals 421-422 in order to quickly heat the phase change material above its melting point, whereas changing from an amorphous phase toward or to a crystalline phase can be achieved by applying a longer lower voltage pulse to one or both of the opposing terminals 421-422 in order to heat the phase change material to its crystallization temperature and then allowing it to cool.

Figure 5A:
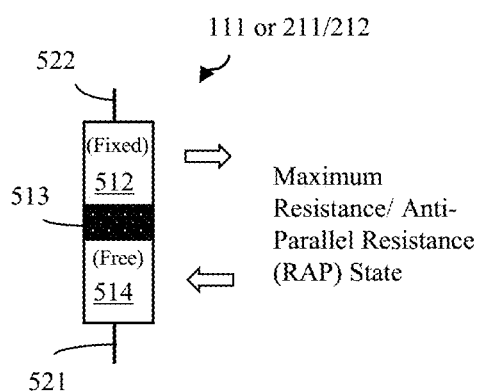
FIGS. 5A-5B are cross-section diagrams illustrating some resistance states of a magnetic tunnel junction (MTJ)-type programmable resistor that could be incorporated into the disclosed structure.
Figure 5B:
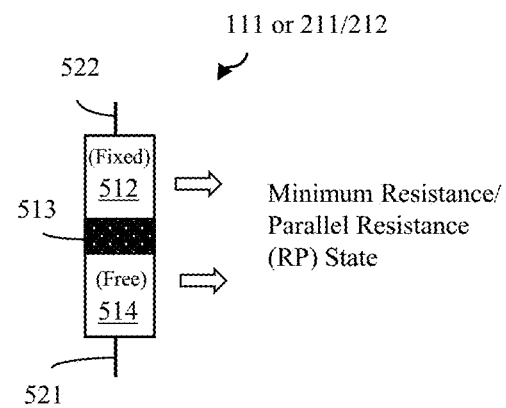

FIGS. 5A-5B illustrate an MTJ-type programmable resistor that could be employed in a memory element 110, 210 as the programmable resistor(s) 111, 211-212. An MTJ-type programmable resistor is typically a back end of the line (BEOL) multi-layered structure, which includes a free ferromagnetic layer 514 (also referred to as a switchable layer) at a first terminal 521, a fixed ferromagnetic layer 512 (also referred to as a pinned layer) at a second terminal 522, and a thin dielectric layer 513 (e.g., a thin oxide layer) between the free ferromagnetic layer 514 and the fixed ferromagnetic layer 512. Depending upon the biasing conditions on the two terminals 521-522 and, particularly, depending on the voltage differential between the two terminals during a write operation, the MTJ-type programmable resistor can exhibit different stable resistance states. For example, during a write operation, a high positive voltage (Vcc) can be applied to the second terminal 522 and the first terminal 521 can be discharged to ground (e.g., at 0V). In this case, the free ferromagnetic layer 514 switches to (or maintains) the anti-parallel resistance (RAP) state (also referred to as a high resistance state) (see FIG. 5A). Alternatively, during the write operation, Vcc can be applied to the first terminal 521 and the second terminal 522 can be discharged to ground (e.g., at 0V). In this case, the free ferromagnetic layer 514 switches to (or maintains) a parallel resistance (RP) state (also referred as a low resistance state) (see FIG. 5B). The MTJ structure described above has two resistance states. However, the example is not intended to be limiting and those skilled in the art will recognize that MTJ-type programmable resistors have been developed that can exhibit more than two different resistance states.

Referring again to FIGS. 1 and 2, in each memory element 110, 210, one terminal of each programmable resistor (e.g., the input terminal of the programmable resistor 111 or the input terminals of both the first and second programmable resistors 211-212) can be electrically to a corresponding input node 119, 219 (either directly or indirectly through an amplifier 115, 215 or voltage buffer 116, 216, as discussed in greater detail below). The output terminal of each programmable resistor can be connected to a bitline with the output terminals of the programmable resistors in a dual resistor memory element being connected to different bitlines. That is, each memory bank can include one or more bitlines and the number of bitlines per memory bank can be equal to the number of programmable resistors per memory element. Thus, as illustrated, each memory element 110 in the structure 100 of FIG. 1 has a single programmable resistor with an input terminal connected to an input node 119 and an output terminal connected to a bitline 101, whereas each memory element 210 in the structure 200 of FIG. 1 has first and second programmable resistors 211-212 having input terminals connected to the same input node 219 and output terminals connected to different bitlines and, particularly, to first and second bitlines 201-202, respectively (as discussed in greater detail below).

For in-memory processing, such as for in-memory matrix vector multiplication processing, the structure 100, 200 can operate in a normal operational mode (also referred to herein as the mission mode). During the normal operational mode, each memory element 110, 210 has already been pre-programmed.

For example, in the structure 100 of FIG. 1, each memory element 110 has already been pre-programmed (e.g., as discussed in in greater detail below) to store a total weight value (also referred to herein as a total data value or a specific total weight value) as a function of the specific resistance state of the programmable resistor 111.

Also, for example, in the structure 200 of FIG. 2, each dual resistor memory element 210 has been pre-programmed (e.g., as discussed in greater detail below) to store a total weight value as a function of the resistance states of the first and second programmable resistors 211-212 therein. That is, in the memory element 210 in the structure 200 of FIG. 2, the first programmed resistance state of the first programmable resistor 211 can be representative of a positive weight value, the second programmed resistance state of the second programmable resistor 212 can be representative of a negative weight value, and the total weight value stored in the dual resistor memory element 210 can be a function of the first programmed resistance state (i.e., the positive weight value) and the second programmed resistance state (i.e., the negative weight value). That is, the total weight value stored in the memory element 210 can be essentially equal to the difference between the positive weight value corresponding to the first resistance state of the first programmable resistor and the negative weight value corresponding to the second resistance state of the second programmable resistor. Preferably, at least one of the two programmable resistors 211-212 in each dual resistor memory element 210 can be pre-programmed to have a maximum resistance state, which is representative of no weight value. Thus, the total weight value stored in any given dual resistor memory element 210 will be equal to either the specific positive weight value represented by the programmed first resistance state of the first programmable resistor 211 (if the second programmable resistor 212 is programmed to the maximum resistance state) or the specific negative weight value represented by the programmed second resistance state of the second programmable resistor 212 (e.g., if the first programmable resistor 211 is programmed to the maximum resistance state). Alternatively, both programmable resistors can be programmable to have some weight value.

The memory elements 110, 210 of the structure 100, 200 can be arranged in a memory element array. The full size of the memory element array (i.e., the number of columns and rows of memory elements in the memory element array) can depend upon the application. Relatively complex neural networks (e.g., for image processing, for audio processing, or the like) can require a relatively large memory element array to complete in-memory processing (e.g., including 10's or 100's of memory elements per row and column in the dual resistor memory element array).

In any case, in the structure 100, 200 the memory element array is partitioned (i.e., is a partitioned array). Specifically, each column of memory elements in the dual resistor memory element array is partitioned into two or more smaller groups (also referred to herein as sub-columns). For purposes of this disclosure, each partition (or section) of a memory element array that includes such a sub-column is referred to herein as a memory bank 199, 299.

With partitioning as described above, the structure 100, 200 includes an array 190, 290 of memory banks 199, 299 (i.e., partitions or sections) that are arranged columns (C0-Cy) and rows (R0-Rx). Since only the columns of the memory elements from the memory element array are partitioned, the total number of columns (C) of memory banks 199, 299 within the memory bank array 190 is the same as the total number of columns of memory elements from the pre-partitioned memory element array.

In some embodiments, each memory bank 199, 299 can have the same number (m+1) of multiple rows (r0-rm) of memory elements 110, 210 therein and the total number of memory banks 199, 299 in each column times the total number of rows of memory elements 110, 210 in each memory bank 199, 299 can be equal to the total number of rows of memory elements 110, 210 as in the memory element array prior to partitioning. Thus, for example, if a 64×64 memory element array is partitioned in the structure 100, 200, there will be 64 columns (C0-C63) of memory banks and x+1 rows (R0-Rx) of memory banks 199, 299, each with m+1 rows (r0-rm) of memory elements 110, 210, where x≥1 and m≥1, where 64 is divisible by x+1, and where the number m+1 is a whole number equal to 64/x+1. That is, the number of rows (R0-Rx) of memory banks 199, 299 could be 2 with each memory bank 199, 299 having 32 rows (r0-rm) of dual resistor memory elements 110, 210; the number of rows (R0-Rx) of memory banks 199, 299 could be 4 with each memory bank 199, 299 having 16 rows (r0-rm) of memory elements 110, 210; the number of rows (R0-Rx) of memory banks 199, 299 could be 8 with each memory bank having 8 rows (r0-rm) of memory elements 110, 210; and so on. Similarly, if a 128×128 memory element array is partitioned in the structure 100, 200 there will be 128 columns (C0-C127) of memory banks 199 and x+1 rows (R0-Rx) of memory banks 199 with m+1 rows (r0-rm) of memory elements 110, 210 in each memory bank 199, 299, where x≥1 and m≥1, where 128 is divisible by x+1, and where the number m+1 is a whole number equal to 128/x+1. If a 256×256 memory element array is to be partitioned in the structure 100, 200, there will be 256 columns (C0-C255) of memory banks 199, 299 and x+1 rows (R0-Rx) of memory banks 199, 299 with m+1 rows (r0-rm) of memory elements 110, 210 in each memory bank 199, 299, where x≥1 and m≥1, where 256 is divisible by x+1, and where the number m+1 is a whole number equal to 256/x+1, and so on. For purposes of illustration, a 2×2 memory bank array with only three rows of memory elements per memory bank is shown in the figures.

However, in the disclosed embodiments partitioning of the columns of memory elements of a memory element array into memory banks is performed by designers to minimize the effect of wiring resistance across the array (as discussed in greater detail below). Thus, there is no requirement for uniform partitioning. For example, in some embodiments each memory bank could have the maximum number of rows necessary before buffering becomes necessary with the last memory bank in each column having some lessor number of rows to include. In other embodiments, the number of rows in each memory back in each column can drop (with each memory bank or with each group of memory banks) between the first memory bank in the column to the last memory bank in the column. Therefore, it should be understood that the figures are not intended to be limiting. Alternatively, the memory bank array 190, 290 in the structure 100, 200 could include any number of two or more columns (C0-Cy) of memory banks 199, 299 and any number of two or more rows (R0-Rx) of memory banks 199, 299 with any number of two or more rows (r0-rm) in any given memory bank within each column with the number of rows in each memory bank in each column being the same or different.

In any case, each memory bank 199, 299 can include a sub-column of memory elements 110, 210, as discussed above. Each memory bank 199, 299 can further include corresponding input nodes 119, 219, one for each memory element 110, 210 in the sub-column. Each memory bank 199, 299 can further include one or more bitlines and, particularly, the same number of bitlines as there are programmable resistors in each memory element 110, 210. Thus, in the structure 100 of FIG. 1, each memory bank 199 can include a single bitline 101. The programmable resistor 111 of each memory element 110 in the sub-column of a memory bank can have an input terminal connected to the corresponding input node 119 directly (or, indirectly via an amplifier 115 or voltage buffer 116, as discussed below), and an output terminal connected to the bitline 101. In the structure 200 of FIG. 2, each memory bank 299 can include two bitlines and, particularly, a first bitline 201 and a second bitline 202. The first programmable resistor 211 and the second programmable resistor 212 of each dual resistor memory element 210 in the sub-column of a memory bank can have their respective input terminals connected to each other and to the corresponding input node 219 directly (or, indirectly via an amplifier 215 or voltage buffer 216, as discussed below), and their respective output terminals connected to the first bitline 201 and the second bitline 202, respectively.

The discussion below refers to initial memory banks in the rows (R0-Rx) of memory banks. The initial memory banks refer to the first memory banks 199, 299 at the beginning of each row (R0-Rx) of memory banks 199, 299 within the first column (C0). Within the structure 100, 200, each initial memory bank can include THs 170 and amplifiers 115, 215. Specifically, in each initial memory bank 199, 299 in the structure 100, 200, there is a TH 170, 270 and amplifier 115, 215 connected in series with a corresponding memory element 110, 210.

Specifically, for each memory element 110, 210 in an initial memory bank 199, 299, there is an amplifier 115, 215 connected in series between a TH 170, 270 and the input terminal(s) of the programmable resistor(s) the memory element 110, 210. When the structure 100, 200 is in the normal operational mode for in-memory processing (e.g., for in-memory matrix vector multiplication processing), specific input voltages can be sampled by the THs 170, 270 so that they are received at the corresponding input nodes 119, 219 (e.g., $V0_{R0}$ at the first row (r0) in the bank R0:C0, $V1_{R0}$ at the second row (r1) in the bank R0:C0; and so on). The specific input voltages can, for example, correspond to specific activation values.

Those skilled in the art will recognize that a TH refers to an analog device that samples the voltage of a variable analog signal (e.g., in response to a control signal, such as a clock signal or some other control signal) and stores its value at for some period of time dependent upon the control signal). Each TH 170, 270 can, as illustrated, include a switch 171, 271 (e.g., a transistor-based switch or some other suitable switch) and a capacitor 172, 272. The switch 171, 271 can be connected on one side to an analog voltage terminal and on the opposite side to a track node (e.g., at the input node 119, 219 for the memory element 110, 210). The capacitor 172, 272 can be connected between the track node and ground. Such a TH 170, 270 can be configured so that, in a track mode, the switch 171, 271 connects the analog voltage terminal to the track node and the capacitor 172, 272 stores a stored voltage equal to the sampled analog voltage at the analog voltage terminal. Such a TH 170, 270 can further be configured so that, in a hold mode, the switch 171, 172 disconnects the analog voltage terminal from the track node such that variations in the analog voltage do not impact circuit operation. It should be understood that the TH structure described above and illustrated in the drawings is not intended to be limiting. Alternatively, any other suitable TH device, which is configured for track-and-hold operations as described above, could be employed. As discussed in greater detail below, the THs 170, 270 enable pipeline processing. Additionally, such THs can enable interruptions in normal operations (e.g., mid-stream) to preform maintenance operations (e.g., calibration, refreshment programming, etc.) without resulting in data loss.

Each amplifier 115, 215 in an initial memory bank can receive an input voltage from a TH 170, 270 and can be configured to generate and output a level shifted input voltage 114, 214 that is essentially equal to the sum of the specific input voltage and a virtual ground voltage (Vvg), as discussed in greater detail below. That is, the amplifier 115, 215 adds Vvg to the received input voltage. For example, the first amplifier 115, 215 in Bank R0:C0 that receives $V0_{R0}$ can generate and output a level shifted input voltage 114, 214 equal to $V0_{R0}$ plus Vvg, the next amplifier 115, 215 in Bank R0:C0 that receives $V1_{R0}$ can generate and output a level shifted input voltage 114, 214 equal to $V1_{R0}$ plus Vvg, and so on with the last amplifier 115, 215 in Bank Rx:C0 generating and outputting a level shifted input voltage 114, 214 equal to $Vm_{Rx}$ plus Vvg. The level shifted input voltage 114, 214 output from any given amplifier 115, 215 will be applied to the memory element 110, 210 (e.g., to the input terminal of the programmable resistor 111 of the memory element 110; to the input terminals of the first and second programmable resistors 211-212 of that memory element 110, 210).

Those skilled in the art will recognize that Vvg is used in analog circuits to refer to a voltage, which is established on a node, which has a certain DC bias that is maintained at a steady reference potential without being connected directly to that reference potential, and which has 0V from an AC perspective. Vvg is typically established on a node to essentially function as a "ground" terminal that is level shifted by a fixed DC amount. For example, amplifiers can be configured in a negative feedback loop to force their negative input voltage to be equal to the positive input voltage. In this context, the negative input voltage is referred to as Vvg because there is effectively no potential difference between it and the positive terminal. Alternatively, Vvg could be established with a large capacitor which holds a DC voltage and essentially has zero AC across it. Each amplifier 115, 215 can be a simple voltage level shifter (also referred to herein as a level shifting amplifier). Alternatively, each amplifier 115, 215 can be configured as a multistate amplifier, where the output state of any given amplifier 115, 215 is controlled by a unique control bit 113, 213 for that amplifier (e.g., control bit $S0_{R0}$ for the amplifier 115, 215 in the first row of the first initial memory bank R0:C0, control bit $S1_{R0}$ for the amplifier 115, 215 in the next row of the first initial memory bank R0:C0, and so on until the last control bit $Sm_{Rx}$ for the amplifier 115, 215 of the last row of the last initial memory bank Rm:C0). In this case, depending upon the control bit received, an amplifier 115, 215 can output a level shifted input voltage (e.g., during the normal operational mode) or some other suitable output, such as a low output (e.g., ground), a high output (e.g., Vcc), or a high impedance (HiZ) output. Different outputs, such as a low voltage, a high voltage, or a HiZ output, could facilitate other operational modes such as program or erase operations, as described in greater detail below.

The structure 100, 200 can further include sets of row interconnect lines 155, 255. Each set of row interconnect lines 155, 255 can interconnect adjacent memory banks within the same row (R0-Rx) of memory banks. Specifically, each row interconnect line 155, 255 within a set between adjacent memory banks of a given row of memory banks can connect the input terminal(s) of the programmable resistor(s) on one memory element 110, 210 at a particular bank row address (e.g., r0-rm) in an upstream memory bank to the input node for another memory element at the same bank row address in an adjacent downstream memory bank. Thus, for example, if the structure 100, 200 only includes two columns of memory banks (e.g., if C0 is the initial memory bank in a given row of memory banks and Cy is the next and last memory bank in the same row), the first row interconnect line 155 in the set between Bank R0:C0 and Bank R0:Cy would connect the connected input terminal(s) of the programmable resistor(s) of the memory element 110, 210 in row r0 of Bank R0:C0 to the input node 119, 219 for the memory element 110, 210 in row r0 of the adjacent downstream Bank R0:Cy, the second row interconnect line 155, 255 in the set between Bank R0:C0 and Bank R0:Cy would connect the connected input terminal(s) of the programmable resistor(s) of the memory element 110, 210 in row r1 of Bank R0:C0 to the input node 119, 219 for the memory element 110, 219 in row r1 of the downstream Bank R0:Cy, and so on. Thus, the level shifted input voltages generated by the amplifiers in the initial memory banks are transmitted along row interconnect lines to memory elements at the same address in the downstream memory banks within the same row.

Optionally, to minimize IR drops across the row interconnect lines as the level shifted input voltages are communicated to each memory element at the same address in each memory bank in the same row, some embodiments of the disclosed structure can include optional voltage buffers 116, 216 (also referred to herein as voltage boost amplifiers). For example, if the size of the array of memory banks is relatively large and, particularly, if the number of columns (C0-Cy) is so large that significant IR drops are exhibited along the row interconnect lines 155, 255, then at least some of memory banks 199, 299 can have integrated voltage buffers 116, 216 (e.g., between the input nodes 119, 219 and the memory elements 110, 210) to buffer the level shifted input voltages and, thereby compensate for IR drops.

As mentioned above, each memory bank 199, 299 can further include at least one bitline. For example, in the structure 100 of FIG. 1, each memory bank 199 can have a single bitline 101 and the programmable resistor 111 of each memory element 110 in the memory bank 199 can have an input terminal connected to a corresponding input node 119 (e.g., either directly or indirectly via an amplifier 115 or voltage buffer 116) and an output terminal connected to a bitline 101. In the structure 200 of FIG. 2, each memory bank 299 can have a first bitline 201 and a second bitline 202 and the first programmable resistor 211 and the second programmable resistor 212 of each dual resistor memory element 210 within the memory bank 299 can have their respective input terminals connected to each other and to the corresponding input node 219 (e.g., either directly or indirectly via an amplifier 215 or voltage buffer 216) and their respective output terminals connected to the first bitline 201 and the second bitline 202, respectively.

Each memory bank 199, 299 can further include the following for each bitline: a bias node, an output node, and a feedback buffer circuit.

Specifically, each memory bank 199 in the structure 100 of FIG. 1 can include a bias node 133 at one end of the bitline 101, an output node 135, and a feedback buffer circuit 120, which is connected to the bias node 133 and the output node 135. The feedback buffer circuit 120 can include, for example, a first transistor 131 (e.g., a first P-type field effect transistor (first PFET)) connected in series between the bias node 133 and the output node 135 and a buffer amplifier 121, which has one input connected to the bias node 133, another input connected to receive Vvg, and an output connected to the gate of the PFET 131.

Similarly, each memory bank 299 of the structure 200 of FIG. 2 can include a first bias node 233 on the first bitline 201, a first output node 235, and a first feedback buffer circuit 220.1, which is connected to the first bias node 233 and to the first output node 235. The first feedback buffer circuit 220.1 can include, for example, a first transistor 231 (e.g., a first P-type field effect transistor (first PFET)) connected in series between the first bias node 233 and the first output node 235 and a first buffer amplifier 221, which has one input connected to the first bias node 233, another input connected to receive Vvg, and an output connected to the gate of the first PFET 231. Similarly, each memory bank 299 can further include a second bias node 234 on the second bitline 202, a second output node 236, and a second feedback buffer circuit 220.2, which is connected to the second bias node 234 and to the second output node 236. The second feedback buffer circuit 220.2 can specifically include a second transistor 232 (e.g., a second PFET) connected in series between the second bias node 234 and the second output node 236 and a second buffer amplifier 222, which has one input connected to the second bias node 234, another input connected to receive Vvg, and an output connected to the gate of the second PFET 232.

With the above-described feedback buffer circuit(s) in each memory bank 199, 299, when the structure 100, 200 is in the normal operational mode for in-memory processing, the bias node on each bitline can be biased to Vvg. Additionally, as mentioned above, the level shifted input voltages, which have each been level shifted by Vvg and which are output by the amplifiers 115, 215, are received at the input terminals of the memory elements 110, 210 in the initial memory banks and further received at the input nodes for the memory elements 110, 210 in the downstream memory banks. As a result, the voltage across the programmable resistor(s) of each memory element 110, 210 at the same bank row address in the memory banks within the same row will be essentially equal to the received input voltage. Additionally, output currents from the programmable resistor(s) in each memory bank are output to and summed on the bitline(s) for that memory bank.

For example, in each memory bank 199 in the structure 100 of FIG. 1, during the normal operational mode, output currents from all programmable resistors 111 of all memory elements 110 in any specific memory bank are output to and summed on the bitline 101, thereby generating a bank-specific output current (I). This bank-specific output current is further buffered by the feedback buffer circuit 120 such that a buffered bank-specific output current (bI), which is dependent on the sum of all output currents from all programmable resistors of all memory elements in the specific memory bank, is output on the output node 135 for the specific memory bank.

Similarly, in each memory bank 299 in the structure 200 of FIG. 2, during the normal operational mode, first output currents from all first programmable resistors 211 of all dual resistor memory elements 210 in any specific memory bank are output to and summed on the first bitline 201, thereby generating a bank-specific first output current (I1). This bank-specific first output current is further buffered by the first feedback buffer circuit 220.1 such that a buffered bank-specific first output current (bI1), which is dependent on the sum of all first output currents from all first programmable resistors of all dual resistor memory elements in the specific memory bank, is output on the first output node 235 for the specific memory bank. Similarly, second output currents from all second programmable resistors 212 of all dual resistor memory elements 210 in the same specific memory bank are output to and summed on the second bitline 202, thereby generating a bank-specific second output current (I2). This bank-specific second output current (I2) is further buffered by the second feedback buffer circuit 220.2 such that a buffered bank-specific second output current (bI2), which is dependent on the sum of all the second output currents from each second programmable resistor of each dual resistor memory element in the specific memory bank, is output on the second output node 236 of the specific memory bank.

The structure 100, 200 can further include column interconnect line(s) for the columns, respectively. For example, the structure 100 can include a column interconnect line 151 for each column and electrically connected to all output nodes 135 of all memory banks 199 in that column. That is, the column interconnect line 151 for column C0 will be connected to the output nodes 135, respectively, of all memory banks in the column C0 (i.e., for Banks R0:C0-Rx: C0), and so on. When the structure 100 is in the normal operational mode for in-memory processing, the column interconnect line 151 for any specific column can receive and sum the buffered bank-specific output currents from all the memory banks in that specific column, thereby generating a column-specific output current (e.g., $tbI_{C0} = bI_{R0:C0} + \pm bI_{Rx:C0}$; . . . ; and $tbI_{Cy} = bI_{R0:Cy} + \ldots + bI_{Rx:Cy}$). Similarly, the structure 200 of FIG. 2 can include a pair of column interconnect lines for each column. Each pair of column interconnect lines can include a first column interconnect line 251, which is electrically connected to all first output nodes 235 of all memory banks 299 in the same column, and a second column interconnect line 252 connected to all second output nodes 236 of all memory banks in the same column. That is, the first and second column interconnect lines 251-252 for column C0 will be connected to the first and second output nodes 235-236, respectively, of all memory banks in the column C0 (i.e., for Banks R0:C0-Rx:C0), and so on. When the structure 200 is in the normal operational mode for in-memory processing, the first column interconnect line 251 for any specific column can receive and sum the buffered bank-specific first output currents from all the memory banks in that specific column, thereby generating a column-specific first output current (e.g., $tbI1_{C0}=bI1_{R0:C0}+ \ldots +bI_{Rx:C0}; \ldots ;$ and $tbI1_{Cy}= bI1_{R0:Cy}+ \ldots +bI_{Rx:Cy}$). Similarly, the second column interconnect line 252 for the specific column can receive and sum the buffered bank-specific second output currents from all the memory banks in the specific column, thereby generating a column-specific second output current (e.g., $tbI2_{C0}=bI2_{R0:C0}+\pm bI2_{Rx:C0}; \ldots ;$ and $tbI2_{Cy}= bI2_{R0:Cy}+ \ldots +bI2_{Rx:Cy}$). In each of these structures 100 and 200, by buffering the bank-specific output currents output to each column interconnect line the impact of wiring resistance across the length of the columns is diminished.

The structure 100, 200 can further include data processing elements 185, 285 at the end of each column.

For example, the structure 100 of FIG. 1 can further include data processing elements and, particularly, current-to-voltage converters 185 (also referred to herein as converters or current-to-voltage converter circuits) for each column. Each current-to-voltage converter 185 can be connected to the column interconnect line 151 for that column, can receive the column-specific output current from the column interconnect line 151, and can generate and output a column-specific analog output voltage 189 based on the column-specific output current. Since output currents from memory elements 110 in each memory bank are generated on the bitline 101 in the memory bank as a function of programmed resistance states representing a weight value and on received input voltages representing activation values, the column-specific output current on each column interconnect line 151 can represent a current value solution for a dot product computation and the column-specific analog output voltage can represent a voltage value solution for that dot product computation.

FIGS. 6A-6E are schematic diagrams illustrating current-to-voltage converters 185, respectively, that could be incorporated into the structure 100.

Figure 6A:
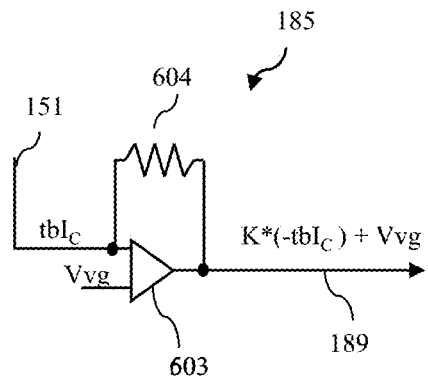
FIGS. 6A-6E are schematic diagrams illustrating current-to-voltage converter circuits that could specifically be incorporated into the disclosed structure of FIG. 1.

The current-to-voltage converter 185 of FIG. 6A includes an amplifier 603 and a feedback resistor 604. The amplifier 603 has a first input connected to the column interconnect line 151, a second input connected to receive Vvg, and an output. The feedback resistor 604 is connected between the output and the first input of the amplifier. The feedback resistor 604 can be the same type of programmable resistor as that used in the memory elements. It should be noted that the polarity of the column-specific analog output voltage 189 from the amplifier 603 will be the opposite of that of the column-specific output current on the column interconnect line 151.

Figure 6B:
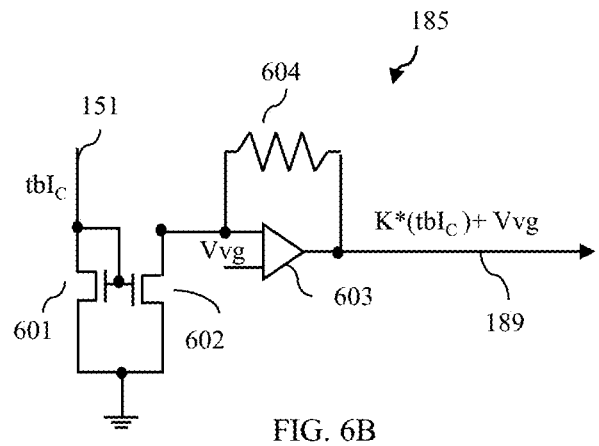

The current-to-voltage converter 185 of FIG. 6B is similarly to the current-to-voltage converter of FIG. 6A but includes additional circuitry to ensure the polarity of the column-specific output current on the column interconnect line and the column-specific output voltage are the same. That is, the current-to-voltage converter 185 includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6C:
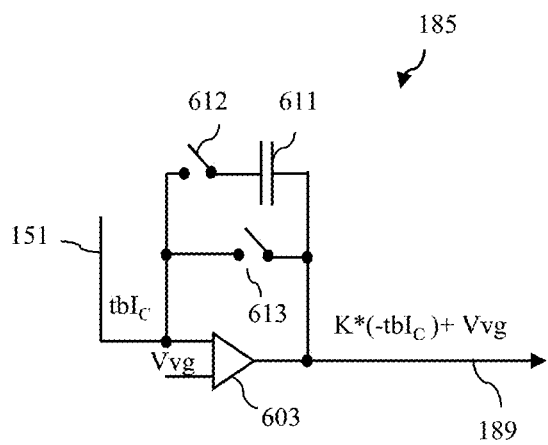

The current-to-voltage converter 185 of FIG. 6C includes the amplifier 603, but instead of a feedback resistor, it can include a feedback switched capacitor circuit. Specifically, the amplifier 603 has a first input connected to the column interconnect line 151, a second input connected to receive Vvg, and an output. The feedback switched capacitor circuit includes a capacitor 611 that is connected to the output of the amplifier 603 and further connected by a first switch 612 to the first input. The feedback switched capacitor circuit can also include a bypass switch 613 that connects the output to the first input of the amplifier 603, bypassing the capacitor 611. In operation, initially the bypass switch 613 is closed to stabilize the high impedance node at Vvg. Then, the bypass switch 613 is opened and there will be a finite integration time across the capacitor 611. This integration time can be made to be proportional to the temperature coefficient of a programmable resistor used in the memory elements. Alternatively, the integration time can be made proportional to a resistor that is made of the same material as the programmable resistors and whose value at the typical temperature of operation is fixed. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal and will compensate for the temp-coefficient. Furthermore, due to the switched capacitor circuit configuration, the value of the output can be held for some duration of time (e.g., track-and-hold circuit), the capacitor 611 can reference some other bias potential, and the power for the op-amp can be turned off to save power. It should be noted that the polarity of the column-specific analog output voltage 189 from the amplifier 603 will be the opposite that of the column-specific output current on the column interconnect line 151.

Figure 6D:
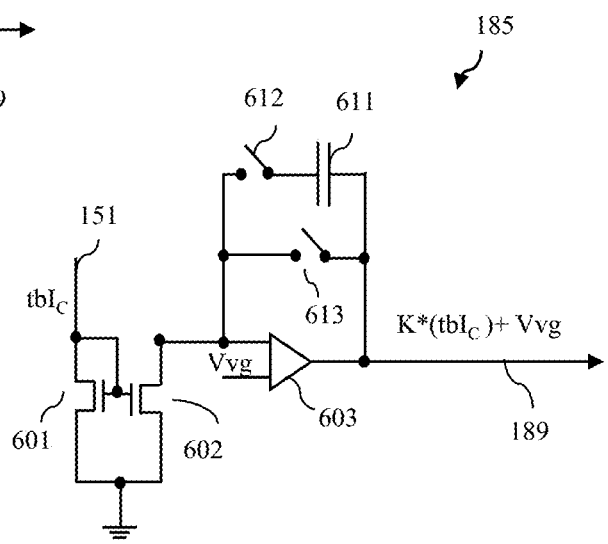

The current-to-voltage converter 185 of FIG. 6D is similar to the current-to-voltage converter of FIG. 6C but includes additional circuitry to ensure the polarity of the column-specific output current on the column interconnect line and the column-specific output voltage are the same. Specifically, in this case the current-to-voltage converter includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6E:
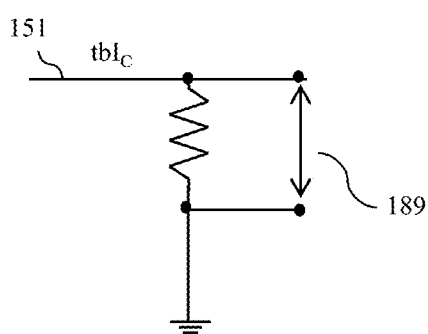

The current-to-voltage converters described above and illustrated in FIGS. 6A-6D are provided for illustration purposes and are not intended to be limiting. Alternatively, any other suitable current-to-voltage converter circuit could be incorporated into the structure 100. For example, the current-to-to voltage converter could, alternatively, be in the form of a simple resistor connected between the column interconnect line and ground, as shown in FIG. 6E.

The structure 200 of FIG. 2 can include data processing elements and, particularly, subtractors 285 (also referred to herein as subtractor circuits). Each subtractor 285 for each column can be connected to the pair of the column interconnect lines 251-252 for that column, can receive the column-specific first output current from the first column interconnect line 251 and the column-specific second output current from the second column interconnect line 252 (e.g., $tbI1_{C0}$ and $tbI2_{C0}$; ... ; and $tbI1_{Cy}$ and $tbI2_{Cy}$, respectively), and can generate and output a column-specific analog output parameter 289 (e.g., a column-specific analog output voltage ($Vout_{C0-y}$) or column-specific analog output current ($Iout_{C0-y}$)) based on the difference between the column-specific first output current and the column-specific second output current (e.g., $Vout_{C0}$ or $Iout_{C0}$ as a function of $tbI1_{C0}$-$tbI2_{C0}$; ... ; and $Vout_{Cy}$ or $Iout_{Cy}$ as a function of $tbI1_{Cy}$-$tbI2_{Cy}$, respectively). Since each first output current is generated on a first bitline 201 in a memory bank as a function of a first programmed resistance state representing a positive weight value and an input voltage that represents an activation value and since each second output current is generated on the second bitline 202 in each memory bank as a function of a second programmed resistance state representing a negative weight value and the same input voltage, the column-specific first output current can represent a solution for a positive side of a dot product computation, the column-specific second output can represent a solution for a negative side of a dot product computation, and the column-specific analog output parameter (e.g., the analog output voltage) can represent the combined solution for the dot product computation.

Figures 7A, 7B:
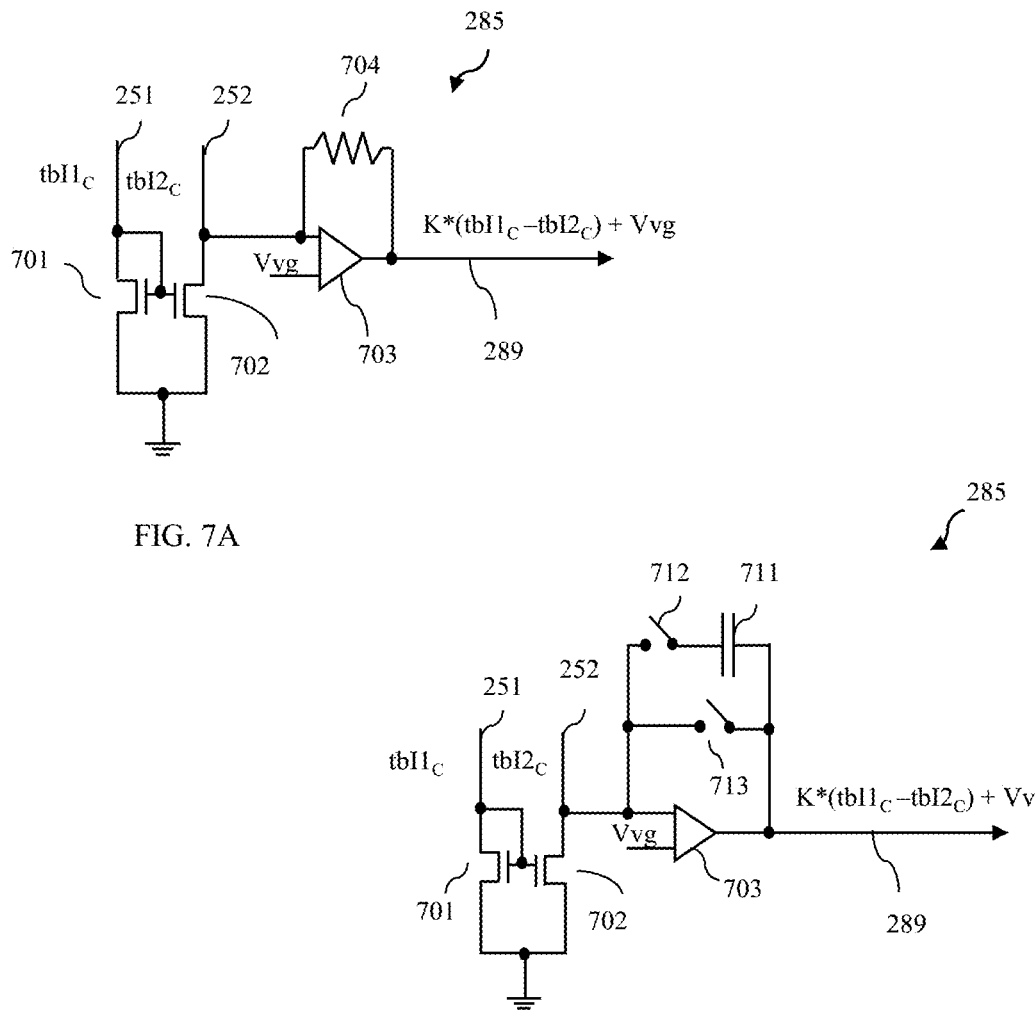
FIGS. 7A-7B are schematic diagrams illustrating subtractor circuits that could specifically be incorporated into the disclosed structure of FIG. 2.

FIGS. 7A-7B are schematic diagrams illustrating subtractors 285, respectively, that could be incorporated into the structure 200.

The subtractor circuit 285 of FIG. 7A includes a first stage and a second stage. The first stage includes first and second n-type field effect transistors (NFETs) 701-702 connected in series between the first and second column interconnect lines 251-252, respectively, of a given column and ground. The drain node of the first NFET 701 control the gates of the first and second NFETs 701-702. The second stage includes an amplifier 703 and a feedback resistor 704. The amplifier has a first input connected to the drain node of the second NFET 702, a second input connected to receive Vvg, and an output. The feedback resistor 704 is connected between the output and the first input of the amplifier. The feedback resistor 704 can be the same type of programmable resistor used in the memory elements 210.

The subtractor circuit of FIG. 7B similarly includes a first stage and a second stage. The first stage of FIG. 7B is essentially the same as the first stage in FIG. 7A, as discussed above. The second stage includes an amplifier 503, but instead of a feedback resistor, it includes a feedback switched capacitor circuit. Specifically, the amplifier 703 has a first input connected to the drain node of the second NFET 702, a second input connected to receive Vvg, and an output. The feedback switched capacitor circuit includes a capacitor 711 that is connected to the output of the amplifier 703 and further connected by a first switch 712 to the first input. The feedback switched capacitor circuit includes a bypass switch 713 that connects the output to the first input of the amplifier 703, bypassing the capacitor 711. In operation, initially the bypass switch 713 is closed to stabilize the high impedance node at Vvg. Then, the bypass switch 713 is opened and there will be a finite integration time across the capacitor 711. This integration time can be made proportionate to the value of a programmable resistor used in the memory elements. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal from the subtractor and will compensate for the temp-coefficient. Furthermore, due to the switched capacitor circuit configuration, the value of the output can be held for some duration of time (e.g., track-and-hold device), the capacitor 711 can reference some other bias potential, and the power for the op-amp can be turned off to save power.

The subtractor circuits described above and illustrated in FIGS. 7A-7B are provided for illustration purposes and are not intended to be limiting. Alternatively, any other suitable subtractor circuit could be incorporated into the structure 200.

Optionally, the structure 100, 200 can further include multiplexors (not shown). Each multiplexor can have a single output port connected to an amplifier 115, 215 for corresponding memory element 110, 210. Each multiplexor can further have two or more input ports. Depending upon the operational mode of the structure, the multiplexor can selectively connect one of its input ports to the output port and, thereby to the amplifier 115, 215. The input ports can receive different inputs, respectively, which may be required for different operational modes. For example, one input port could be connected to a TH 170, 270 for a normal operating mode, another input port could be connected so as to receive a ground voltage (e.g., for use in an offset compensation mode), and/or yet another input port could be connected so as to receive some other voltage for use in some other operational mode. Also, optionally, the structure 100, 200 can further include output monitors 186, 286 connected to the data processing elements 185, 285. Each monitor 186, 286 could be, for example, a comparator that compares the column-specific analog output voltage to a predetermined voltage. For example, the comparator can compare the column-specific analog output voltage to Vvg. If the column-specific analog output voltage is higher than Vvg, then it can be used during the next processing stage. However, if the column-specific analog output voltage is lower than Vvg (e.g., if the output of the comparator is negative), then it can be flagged and any of the following could be performed: (1) the voltage could be nulled and presented to the next processing stage; or (2) the voltage can be attenuated (e.g., by using an uncharged capacitor for charge sharing) to create a piecewise linear transfer function.

As mentioned above, FIGS. 1 and 2 are schematic diagrams illustrating embodiments of a structure 100, 200 including a partitioned memory architecture configured for in-memory processing, such as in-memory matrix vector multiplication processing, including in-memory pipeline processing. It should be understood that with in-memory processing each processing layer (e.g., each multiply and accumulate (MAC) layer) will typically be handled by a discrete structure configured as described above (i.e., a discrete partitioned memory architecture) with the outputs from one structure for one MAC layer being fed, as inputs, to the next structure for the next MAC layer in the series. The number of inputs into a MAC Layer will be greater than the number of outputs from that MAC layer and, thus, the number of inputs to each MAC Layer in the series decreases until a final output is produced. It should be noted that in the absence of THs 170, 270, only serial processing can be performed in order to avoid processing errors. That is, processing of a sample through each structure to the final structure must be completed with the final structure generating a final solution before processing of another sample can begin. However, the presence of the THs 170, 270 in the initial memory banks of each discrete structure 100, 200 in the series, enable pipeline processing to be performed. Specifically, because outputs from an upstream structure can be captured as inputs by THs 170, 270 operating in the track mode in a downstream structure and held constant once the THs 170, 270 in the downstream structure switch to the hold mode regardless of any changes in the outputs from the upstream structure, the THs 170, 270 the upstream structure can switch to the track mode to capture new inputs prior to completion of downstream processing.

FIG. 8 is an example of a timing diagram for such in-memory pipeline processing using a series of discrete structures (e.g., each structure in the series being an instance of a structure 100, 200 described above) to complete a series of MAC layers, respectively, on multiple samples. The in-memory pipeline processing begins with the input MAC layer (Layer 1) structure processing a first sample captured and stored by the THs (Sample 1). Time 1, Sample 1 input voltages are input into the Layer 1 structure (i.e., all activation voltages of Sample 1 are sampled and hold by THs of the Layer 1 structure). Time 2, within the Layer 1 structure, the input voltages of Sample 1 are level-shifted by Vvg and the bitlines are biased to Vvg (i.e., allow settling time for the Vvg buffer). Time 3, within the Layer 1 structure, the current-to-voltage converters or subtractors, as applicable, are activated. Time 4, the column-specific output voltages generated by current-to-voltage converters or subtractors of the Layer 1 structure are fed to the THs of the Layer 2 structure, which processes a hidden MAC layer. These above-described processes are repeated in the Layer 2 structure. That is, Time 4, within the Layer 2 structure, column-specific output voltages from the Layer 1 structure are sampled and held by THs as input voltages. Time 5, within the Layer 2 structure, the input voltages are level-shifted by Vvg and the bitlines are biased to Vvg (i.e., allow settling time for the Vvg buffer). Time 6, within the Layer 2 structure, the current-to-voltage converters or subtractors are activated. Time 7, the column-specific output voltages generated by the current-to-voltage converters or subtractors of the Layer 2 structure are fed to the THs of a Layer 3 structure, which processes another hidden MAC layer. These above-described processes are repeated in the Layer 3 structure. That is, Time 7, within the Layer 3 structure, the column-specific output voltages from the Layer 2 structure are sampled and held by THs as input voltages. Time 8, within the Layer 3 structure, the input voltages are level-shifted by Vvg and the bitlines are biased to Vvg (i.e., allow settling time for the Vvg buffer). Time 9, within the Layer 3 structure, the current-to-voltage converters or subtractors are activated. Time 10, the column-specific output voltages generated by the current-to-voltage converters or subtractors of the Layer 3 structure are fed to the THs of a Layer 4 structure. Layer structure-to-Layer structure processing continues as described above until the final solution for Sample 1 is output by the final Layer structure in the series.

However, as mentioned above, because of the presence of the THs at the beginning of the structure for each Layer, at Time 4, when the THs of the Layer 2 structure have sampled and held the outputs from the Layer 1 structure, Layer 1 can also initiate processing of Sample 2. That is, at Time 4, the THs of the Layer 1 structure can sample and hold the activation voltages of Sample 2. Time 5, within the Layer 1 structure, the input voltages of Sample 2 are level-shifted by Vvg and the bitlines are biased to Vvg (i.e., allow settling time for the Vvg buffer). Time 6, within the Layer 1 structure, the current-to-voltage converter or subtractors, as applicable, are activated. Time 7, the column-specific output voltages generated by current-to-voltage converters or subtractors of the Layer 1 structure are fed to the THs of the Layer 2 structure, which processes a hidden MAC layer. These above-described processes are repeated in the Layer 2 structure, and then again in Layer 3, and so on. Thus, during Time 4-Time 7, processing is being performed by the Layer 1 structure on Sample 2 and, concurrently, downstream processing is being performed by the Layer 2 structure on Sample 1, and so on.

FIG. 8 only shows 3-layer processing. However, it should be understood that FIG. 8 is not intended to be limiting and that such MAC processing typically requires significantly more layers to develop a final solution.

The structures disclosed herein can further include control and connecting circuitry to facilitate performance of the in-memory processing, as described above, and to further feed outputs from the structure to another structure for completion of the next processing layer. In general, control and connection circuits are known in the art and, thus, the details thereof have been omitted from this specification in order to allow the reader to focus on the salient aspects of the disclosed embodiments.

The structures 100, 200 disclosed herein can also include additional components to implement other operational modes (e.g., program modes). For example, as mentioned above prior to operation of the structure 100, 200 in the normal operational mode (i.e., in the mission mode during which in-memory processing is performed), the programmable resistors of the memory elements are programmed to particular resistance states. Depending upon the type of programmable resistors used, different write schemes could be employed to achieve the desired programming and the different write schemes may necessitate the inclusion of additional circuit components. To allow the reader to focus on the salient aspects of the disclosed embodiments specifically related to pipeline processing and to avoid clutter in the figures, these additional circuit components have been omitted from this disclosure. However, FIGS. 9, 10A, 11A, 12A, 13A, 14A, 15A, 16A, 17A, 18A, and 19A are schematic diagrams illustrating additional circuit components that could be incorporated into the structure 100, 200 and used to implement different write schemes, respectively, for an RRAM-type programmable resistor. It should be understood that, while the additional circuit components illustrated in the FIGS. 9, 10A, 11A, 12A, 13A, 14A, 15A, 16A, 17A, 18A, and 19A are shown with respect to the programming of the programmable resistor 111, 211 of a memory element 110, 210, the same additional circuit components could be integrated throughout the structure 100, 200 to facilitate programming of each programmable resistor of each memory element.

Figure 9:
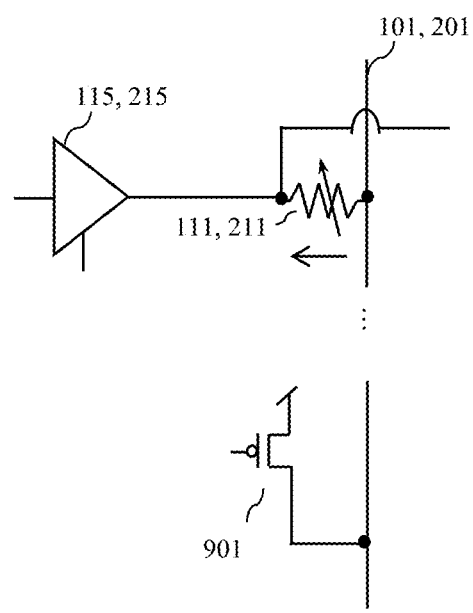
FIG. 9 is a schematic diagram illustrating additional components that could be incorporated into the disclosed structure to implement a writing scheme for programming resistors.

More specifically, FIG. 9 is a schematic diagram illustrating additional components that could be employed to implement one writing scheme. Referring to FIG. 9 in combination with any of FIGS. 1 and 2, a weak PFET 901 can have a source region connected to a positive supply voltage (e.g., Vcc) and a drain region connected to a programming node on a bitline 101, 201. During a write mode, the feedback buffer circuit can be switched off and the output of the amplifier 115, 215 can be switched to a low value. The gate of the PFET 901 can be controlled by a write control signal that is lowered (e.g., by a control signal from a controller, not shown) in small increments to increase the conductivity of the PFET 901. As the PFET 901 gradually turns on, there will be a corresponding increase in programming current through the RRAM 111, 211, thereby increasing the conductivity of the PFET 901. The PFET 901 can subsequently be turned off and the feedback buffer circuit connected to the bitline 101, 201 can be turned back on, again biasing the bitline 101, 201 to Vvg. This ensures that the voltage across the RRAM 111, 211 is kept in a safe zone. It should be noted that with this write scheme one row and one column (or in the case of the structure 200, one side of one column, namely either the first programmable resistor side or the second programmable resistor side) would be selected at any given time so only one RRAM would be programmed at any given time.

Those skilled in the art will recognize that the programming of an RRAM can be accomplished using multiple techniques. The principles of RRAM programming are as follows: (1) the RRAM should be exposed to a sufficiently high voltage that will initiate or continue the formation of filaments and the initiation filament formation relies on an electric field (e-field) driven mechanism; (2) upon forming, it is hypothesized that a reduction in resistance will occur because of charged species "bumping" into atoms and moving them such that the conductivity is increased; and (3) the higher the available current during the above process, the lower the resistance will become (up to a limit). Various closed loop techniques could be employed to achieve resistance programming to a relatively high degree of accuracy.

Figure 10A:
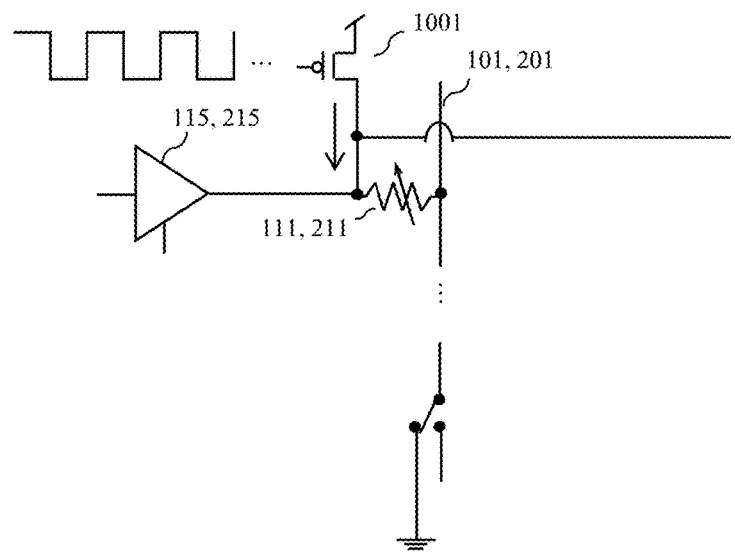
Figure 10B:
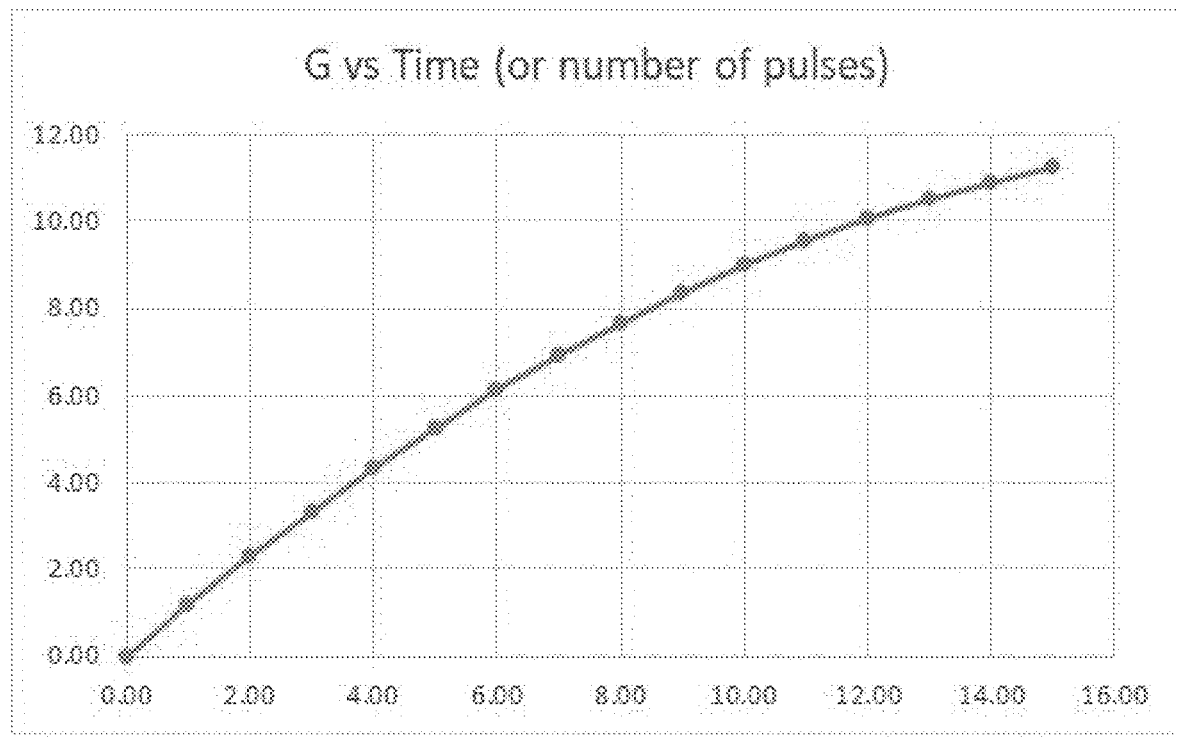

For example, FIG. 10A is a schematic diagram illustrating additional components that could be employed to implement one writing scheme in which conductance is increased by applying an increasing number of pulses to the gate of a single PFET current source. Specifically, referring to FIG. 10A in combination with any of FIGS. 1 and 2, a PFET 1001 can be connected in series between a positive supply voltage (e.g., Vcc) and one terminal of the RRAM 111, 211 and the opposite terminal can be connected via the bitline 101, 201 and a switch to ground. A series of short duration pulses can be applied to the gate of the PFET 1001. Each "0" pulse can provide a relatively large amount of current flow and can induce a sufficiently high voltage to start the filament formation process. As the number of pulses increases, so does the conductance, as shown in FIG. 10B. A feedback loop can be employed to measure the resulting resistance value after N number of pulses.

Figure 11A:
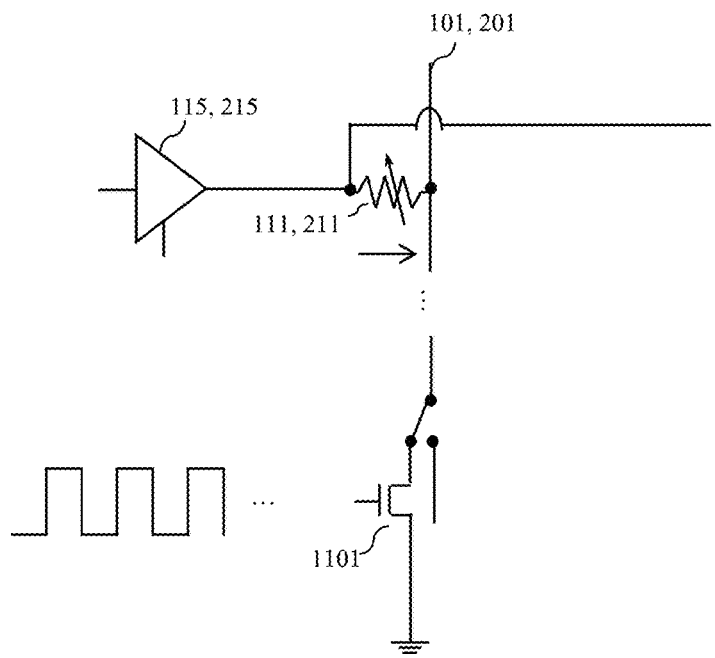
Figure 11B:
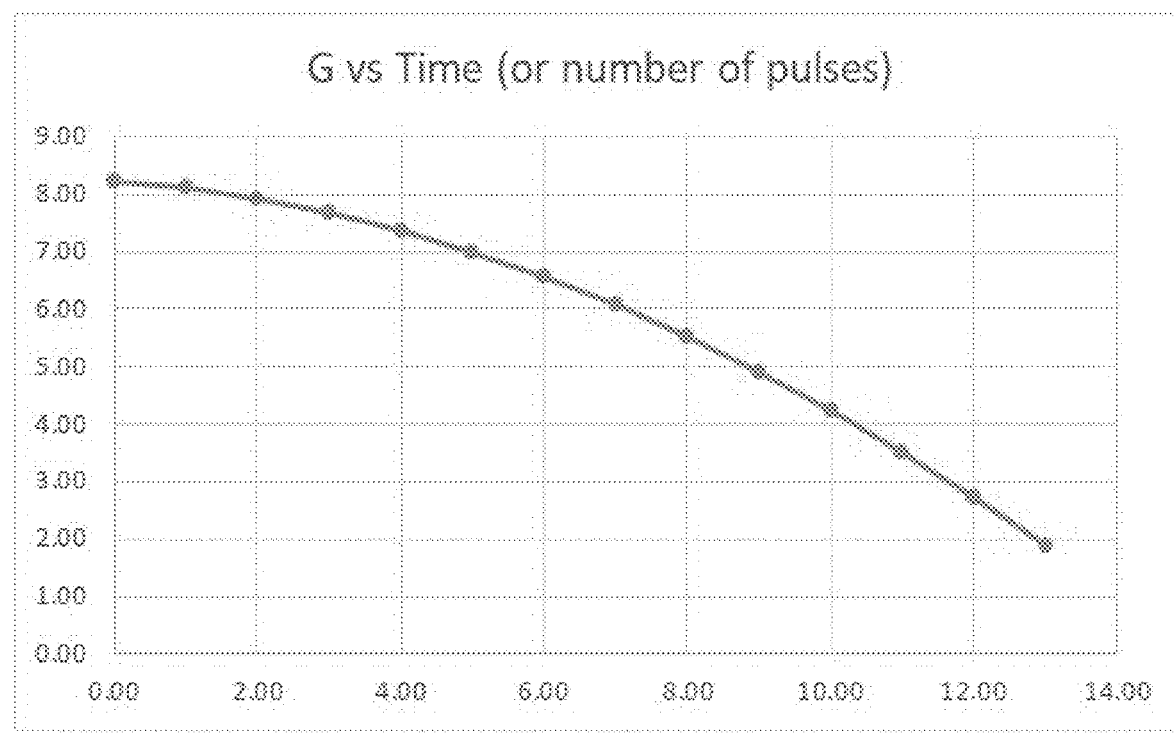

For example, FIG. 11A is a schematic diagram illustrating additional components that could be employed to implement one writing scheme in which conductance is decreased by applying an increasing number of pulses to the gate of single NFET current source. Specifically, referring to FIG. 11A in combination with any of FIGS. 1 and 2, an NFET 1101 can be connected in series between one terminal of the RRAM 111, 211 and ground (e.g., via a switch). A series of short duration pulses can be applied to the gate of the NFET 1101. Each "1" pulse can provide a relatively large amount of current flow and can induce a sufficiently high voltage to start the filament breakdown process. As the number of pulses increases the conductance decreases, as shown in FIG. 11B. A feedback loop can be employed to measure the resulting resistance value after N number of pulses.

Figure 12A:
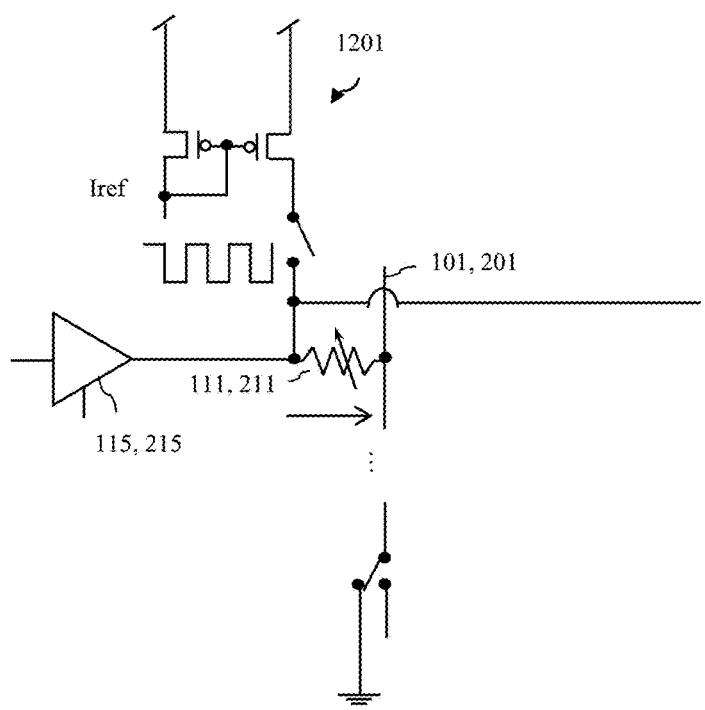
Figure 12B:
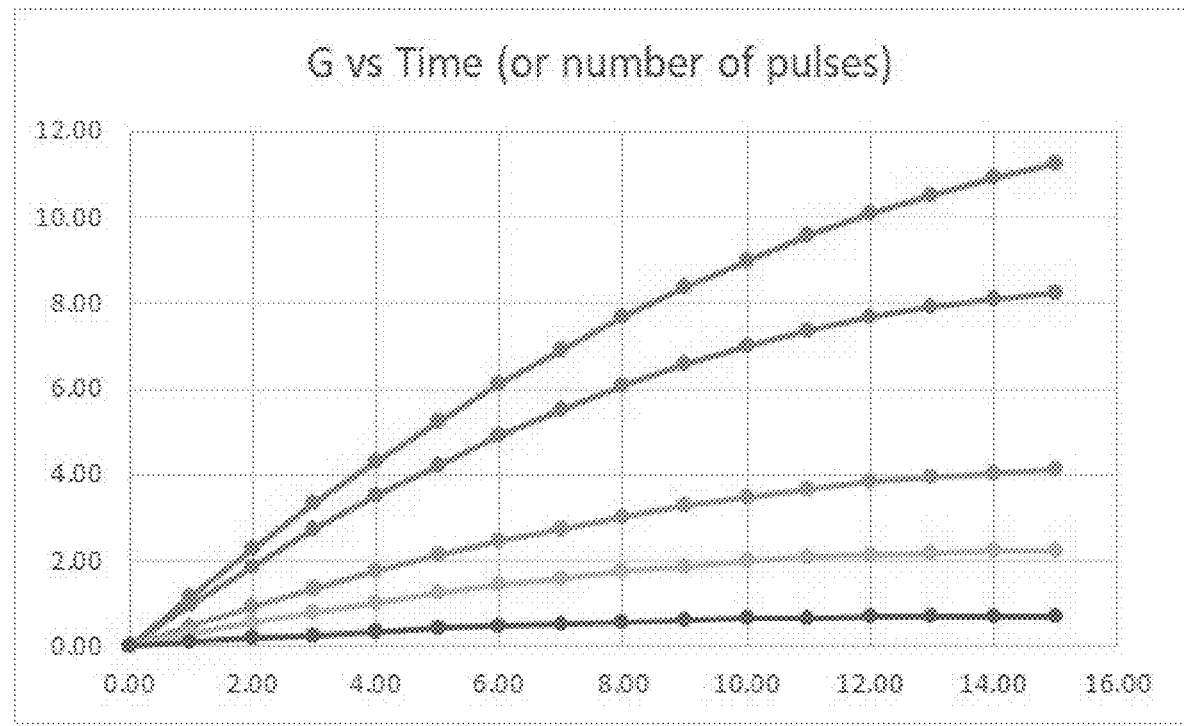

For example, FIG. 12A is a schematic diagram illustrating additional components that could be employed to implement one writing scheme in which conductance is increased using a current mirror-type current source connected to the RRAM 111, 211 by a pulsed switch in series. Specifically, referring to FIG. 12A in combination with any of FIGS. 1 and 2, a dual-PFET current mirror 1001 can have an output node connected by a first switch to one terminal of the RRAM 111, 211 and the opposite terminal can be connected via the bitline 101, 201 and a second switch to ground. A series of short duration pulses can be applied to open and close the switch to cause a relatively large amount of current flow and induce a sufficiently high voltage to start the filament formation process. As the number of pulses increases, so does the conductance, as shown in FIG. 12B. With this configuration Iref at the reference node of the current mirror 1201 can be varied (by various well-known mechanisms) to adjust the rate of conductance changes, also as shown in FIG. 12B. A feedback loop can be employed to measure the resulting resistance value after N number of pulses.

Figure 13A:
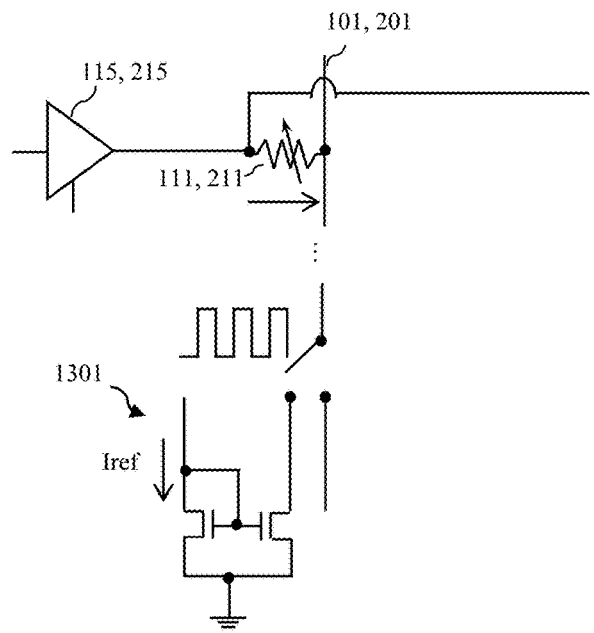
Figure 13B:
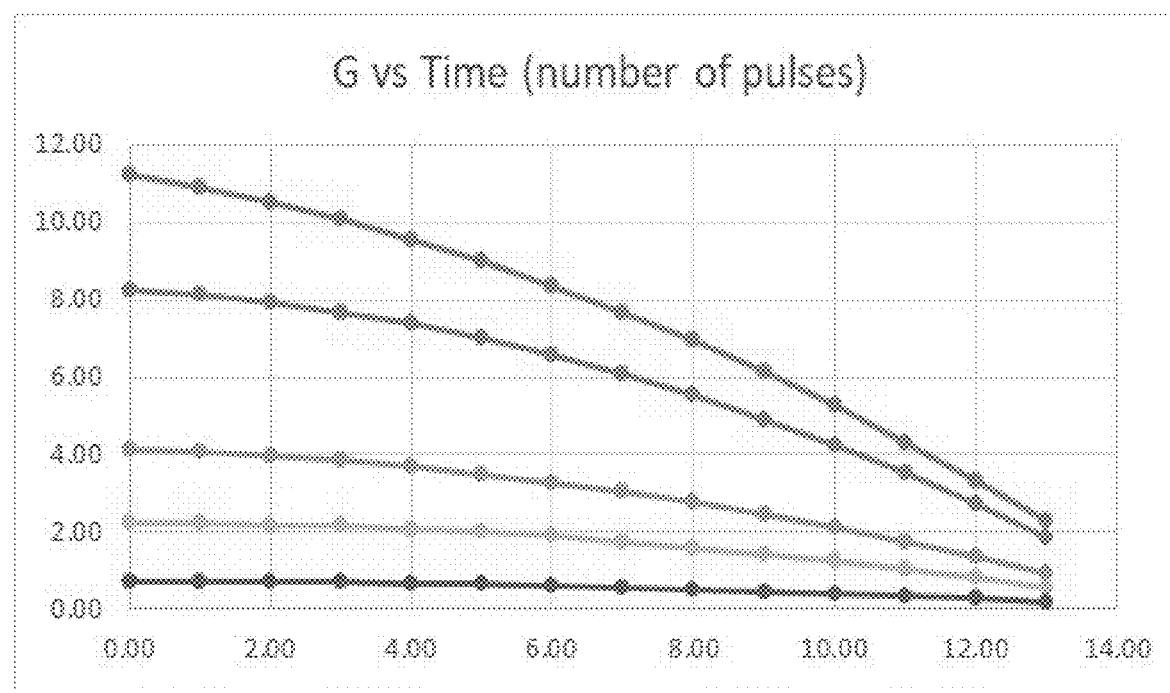
Figure 14A:
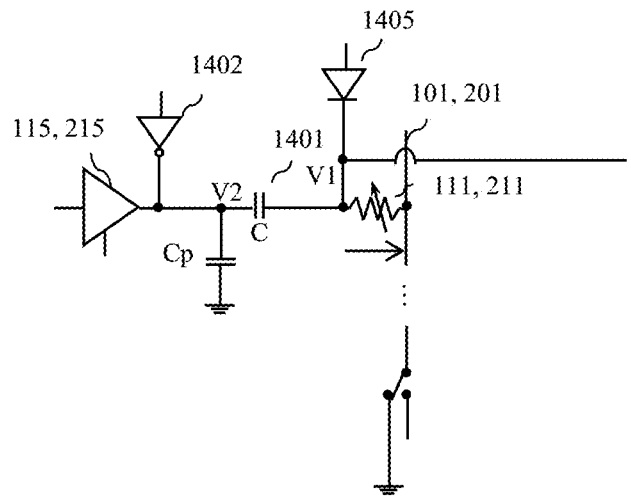
Figure 14B:
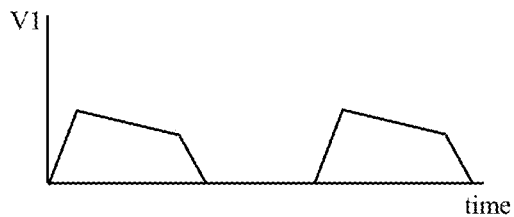
Figure 14C:
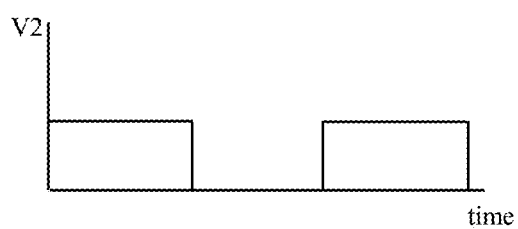
Figure 14D:
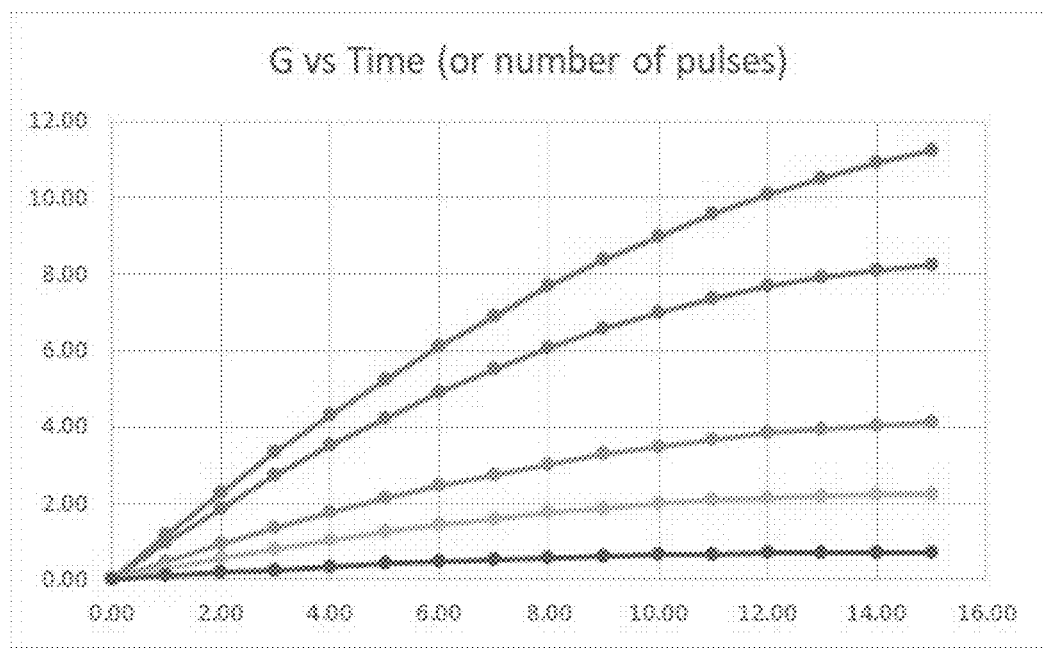

For example, FIG. 13A is a schematic diagram illustrating additional components that could be employed to implement one writing scheme in which conductance is decreased using a current mirror-type current source connected to the RRAM 111, 211 by a pulsed switch in series. Specifically, referring to FIG. 13A in combination with any of FIGS. 1 and 2, a dual-NFET current mirror 1301 can have an output node connected by a switch to one terminal of the RRAM 111, 211. A series of short duration pulses can be applied to open and close the switch to cause a relatively large amount of current flow and induce a sufficiently high voltage to start the filament breakdown process. As the number of pulses increases, the conductance decreases, as shown in FIG. 13B. With this configuration Iref at the reference node of the current mirror 1301 can be varied (by various well-known mechanisms) to adjust the rate of conductance changes, also as shown in FIG. 13B. A feedback loop can be employed to measure the resulting resistance value after N number of pulses FIG. 14A is a schematic diagram illustrating additional components that could be employed to implement one writing scheme in which conductance is increased (i.e., resistance is decreased) using a capacitively coupled current pulse with a catch diode 1405 (e.g., a Schottky diode or any other suitable type of diode). Specifically, a capacitor 1401 can be connected in series between a driver 1402 (e.g., an inverter, as illustrated) and one terminal of the RRAM 111, 211 and the opposite terminal of the RRAM 111, 211 can be connected (e.g., by a switch) to ground. V1 can be a node between the capacitor 1401 and the RRAM 111, 211 and V2 can be a node between the capacitor 1401 and the driver 1402. The catch diode 1405 can be connected to V1. FIGS. 14B and 14C are graphs illustrating changes in V1 and V2, respectively, over time (t). The capacitor 1401 can deliver a peak current of C(dV/dt) and this peak current can decay through the RRAM 111, 211. The value of the peak current can be adjusted by adjusting the value of the coupling capacitor 1401 or the delta-v. The output of the driver 1402 can be loaded with parasitic capacitance (Cp) to slow down the rise time (increase the dt). The current pulses into the RRAM 111, 211 can be proportional to the rise time of V2 (Zout of the driver 1402 and the parasitic capacitance Cp). With this configuration, conductance of the RRAM 111, 211 can be increased with the application of current pulses, as shown in FIG. 14D. It should be noted that the coupling capacitor 1401 can limit the total amount of charge dumped into the RRAM 111, 211 thereby limiting the rate of change of the conductance. For example, with the configuration of FIG. 14A, during a write operation, nodes V1 and V2 can initially be held at ground. When the driver 1402 changes state, V2 can switch from ground to Vcc and current can flow through the capacitor 1401 and then the RRAM 111, 211 to ground. This direction of current flow can cause a reduction in the resistance of the RRAM 111, 211 and can pull V2 back down to ground. The catch diode 1405 can prevent node V1 from dropping below (VE-0.3V), thereby preventing any current from flowing in the RRAM 111, 211 in the opposite direction. Thus, the catch diode 1405 can prevent the resistance of the RRAM 111, 211 from increasing. Now, the resistance of the RRAM 111, 211 can be adjusted downward in a unidirectional fashion (i.e., decreased) as a function of the number and magnitude of pulses. That is, the resistance of the RRAM can be reduced with each pulse and the per pulse rate of decrease will depend upon the magnitude of the pulses. In order words, with this configuration, the conductance of the RRAM can be increased with each pulse and the per pulse rate of increase will depend on the magnitude of the pulses.

Figure 15A:
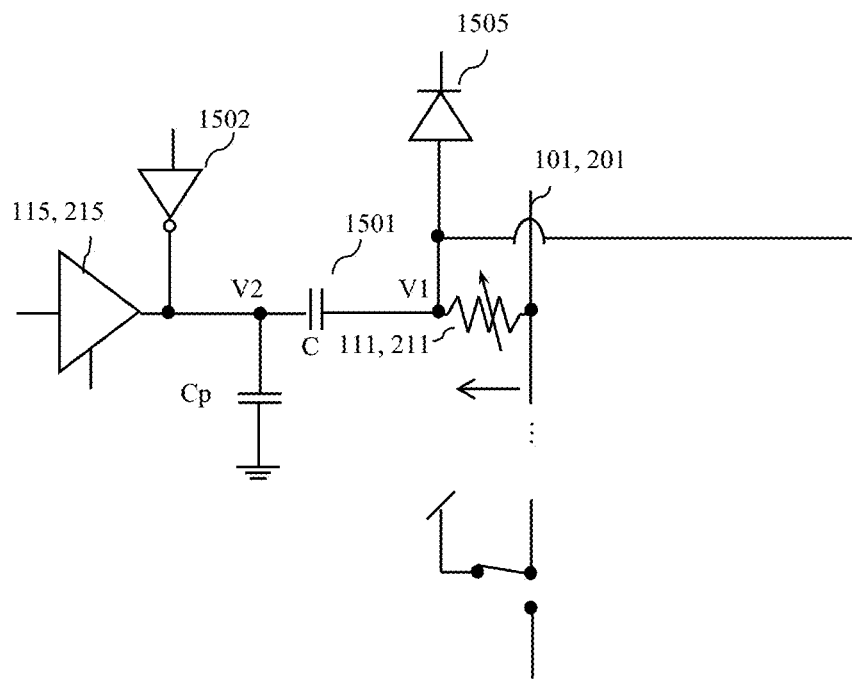
Figure 15B:
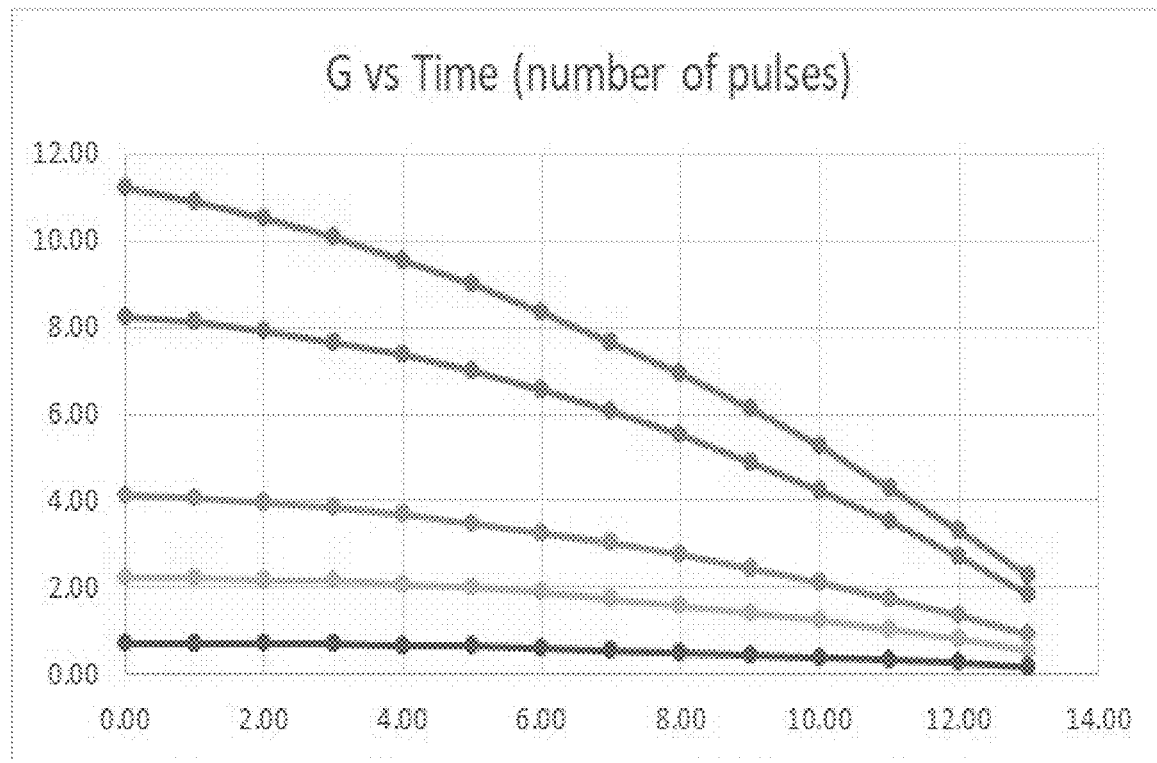

FIG. 15A is a schematic diagram illustrating additional components that could be employed to implement one writing scheme in which conductance is decreased (i.e., resistance is increased) using a capacitively coupled current pulse with a catch diode 1505 (e.g., a Schottky diode or any other suitable type of diode). Specifically, a capacitor 1501 can be connected in series between a driver 1502 (e.g., an inverter, as illustrated) and one terminal of the RRAM 111 and the opposite terminal of the RRAM 111, 211 can be connected to Vcc. V1 can be a node between the capacitor 1501 and the RRAM 111, 211 and V2 can be a node between the capacitor 1501 and the driver 1502. The catch diode 1505 can be connected to V1. The capacitor 1501 can deliver a peak current C(dV/dt) and this peak current can decay through the RRAM 111, 211. The value of the peak current can be adjusted by adjusting the value of the coupling capacitor 1501 or the delta-v. The output of the driver 1502 can be loaded with parasitic capacitance (Cp) to slow down the rise time (increase the dt). The current pulses into the RRAM 111, 211 can be proportional to the rise time of V2 (Zout of the driver 1502 and the parasitic capacitance Cp). With this configuration, the conductance of RRAM 111, 211 can be decreased with the application of current pulses, as shown in FIG. 15B. For example, with this configuration, during a write operation, V1 and V2 can initially be set at Vcc. When the driver 1502 changes state, V2 can switch from Vcc to ground and current can flow through from the RRAM 111 and then through the capacitor 1501 to node V2. This direction of current flow can cause an increase in the resistance of the RRAM 111 and can pull V2 back up to Vcc. The catch diode 1505 can prevent node V1 from increasing above (VE+0.3V), thereby preventing any current from flowing through the RRAM 111 in the opposite direction. Thus, the catch diode 1505 can prevent the resistance of the RRAM 111 from decreasing. Now the resistance of RRAM 111 can be adjusted upward in unidirectional fashion (i.e., increased) as a function of the number and magnitude of pulses. That is, the resistance of the RRAM 111 can increase with each pulse and the per pulse rate of the increase will depend upon the magnitude of the pulses. In order words, the conductance of the RRAM will decrease with each pulse and the per pulse rate of the decrease will depend on the magnitude of the pulses.

Figure 16A:
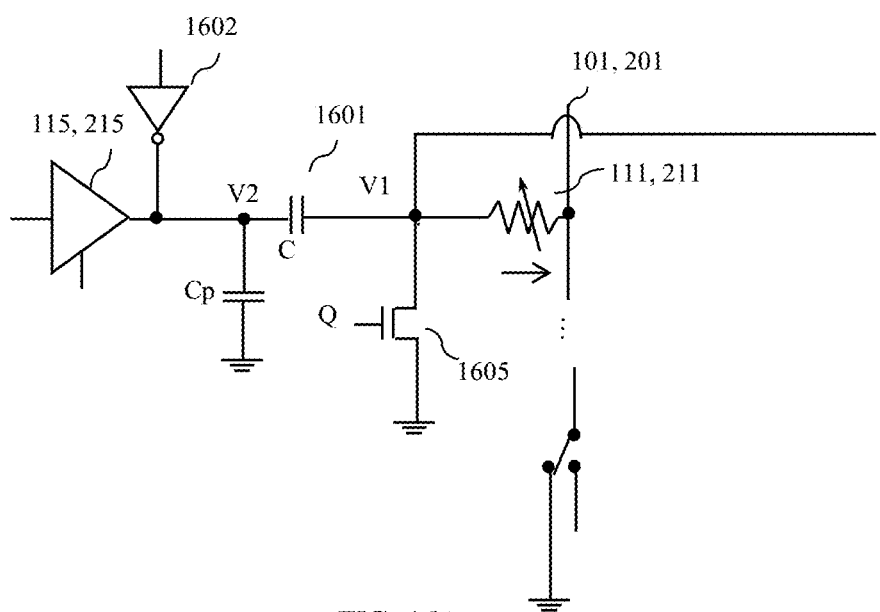
Figure 16B:
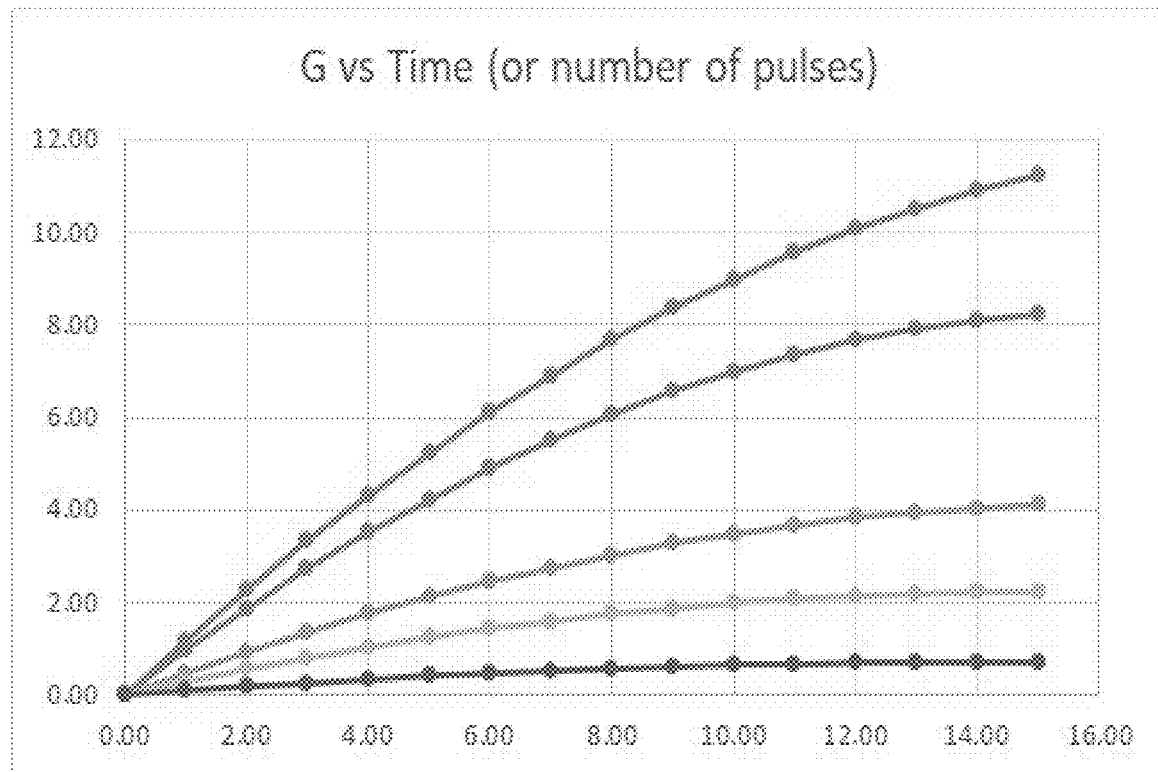

For example, FIG. 16A is a schematic diagram illustrating additional components that could be employed to implement one writing scheme in which conductance is increased using a capacitively coupled current pulse with a synchronous rectifier. Specifically, a capacitor 1601 can be connected in series between a driver 1602 (e.g., an inverter, as illustrated) and one terminal of the RRAM 111, 211 and the opposite terminal of the RRAM 111, 211 can be connected (e.g., by a switch) to ground. V1 can be a node between the capacitor 1601 and the RRAM 111, 211 and V2 can be a node between the capacitor 1601 and the driver 1602. Additionally, an NFET 1605 can be connected in series between the node V1 and ground and can be controlled by a gate voltage (Q). The capacitor 1601 can deliver a peak current of C(dV/dt). This peak current can decay through the RRAM 111, 211. The value of the peak current can be adjusted by adjusting the value of the coupling capacitor 1601 or the delta-v. The output of the driver 1602 can be loaded with parasitic capacitance (Cp) to slow down the rise time (increase the dt). With this configuration, the conductance of RRAM 111, 211 can be increased with the application of current pulses, as shown in FIG. 16B. For example, with the configuration of FIG. 16A, V1 can initially be set at ground by switching Q to Vcc and V2 can also initially be set at ground. When the driver 1602 changes state, V2 can switch from ground to Vcc, thereby causing current to flow through capacitor 1601 and the RRAM 111, 211 to ground. This direction of current flow can cause the resistance of RRAM 111, 211 to be reduced and can pull V2 back down to ground. When V2 changes state from Vcc back to ground but the NFET 1605 is still turned on, node V1 will be clamped to ground and current flow through the RRAM 111, 211 in the opposite direction is prevented. Thus, the NFET 1605 can be used to prevent any increase in the resistance of the RRAM 111, 211. Now, the resistance of the RRAM 111, 211 can be adjusted downward in a unidirectional fashion (i.e., decreased) as a function of the number and magnitude of pulses. That is, the resistance of the RRAM 111, 211 can be reduced with each pulse and the per pulse rate of decrease will depend upon the magnitude of the pulses. In order words, with this configuration, the conductance of the RRAM 111, 211 can be increased with each pulse and the per pulse rate of increase will depend on the magnitude of the pulses.

Figure 17A:
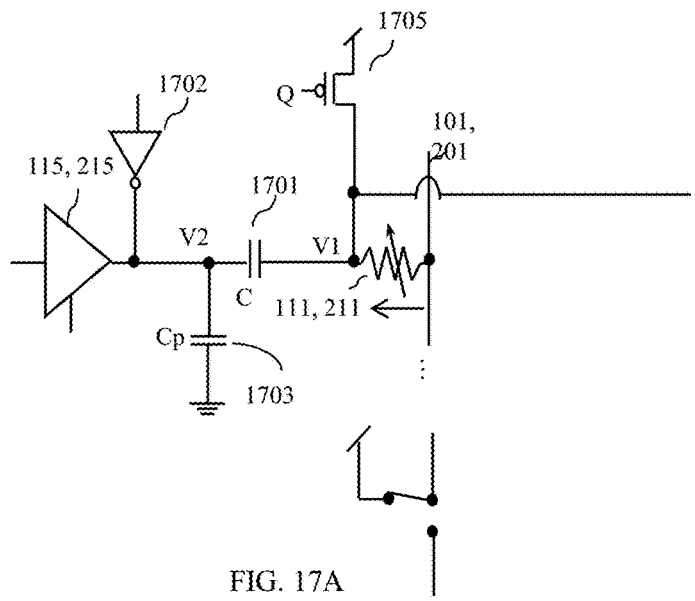
Figure 17B:
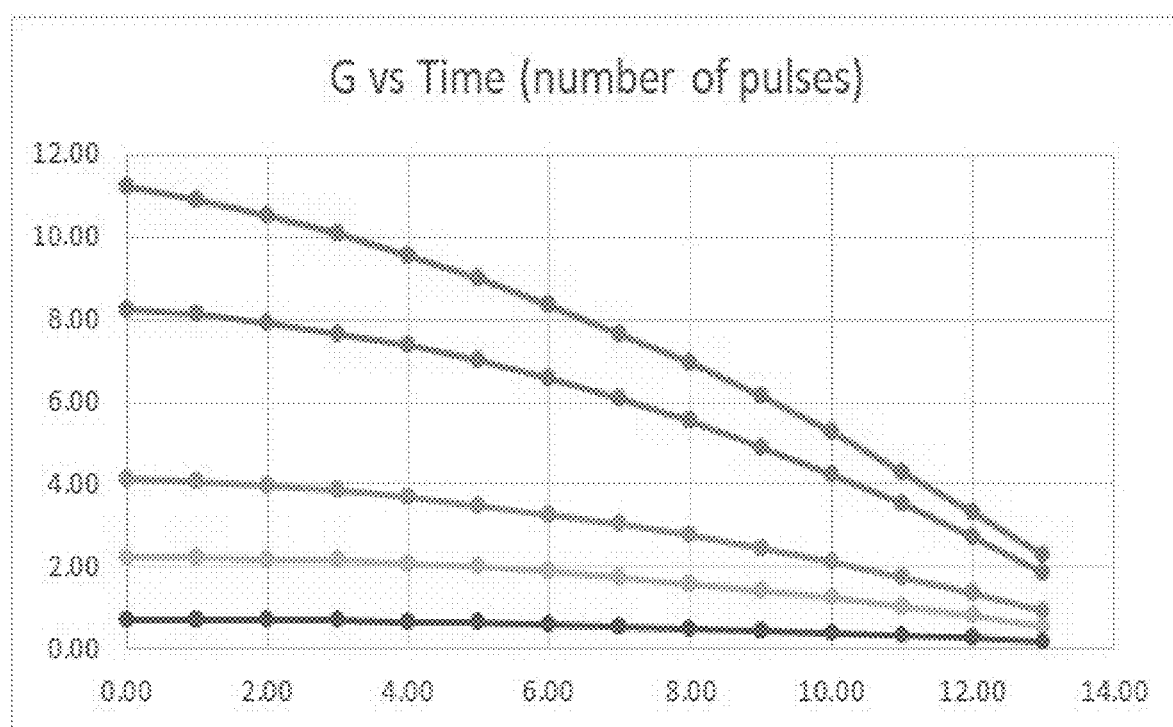

For example, FIG. 17A is a schematic diagram illustrating additional components that could be employed to implement one writing scheme in which conductance is decreased using a capacitively coupled current pulse with a synchronous rectifier. Specifically, a capacitor 1701 can be connected in series between a driver 1702 (e.g., an inverter, as illustrated) and one terminal of the RRAM 111, 211 and the opposite terminal of the RRAM 111, 211 can be connected (e.g., by a switch) to ground. V1 can be a node between the capacitor 1701 and the RRAM 111, 211 and V2 can be a node between the capacitor 1701 and the driver 1702. Additionally, a PFET 1705 can be connected in series between the node V1 and Vcc and can be controlled by a gate voltage (Q). The capacitor 1701 can deliver a peak current of C(dV/dt). This peak current can decay through the RRAM 111, 211. The value of the peak current can be adjusted by adjusting the value of the coupling capacitor 1701 or the delta-v. The output of the driver 1702 can be loaded with parasitic capacitance (Cp) to slow down the rise time (increase the dt). With this configuration, the conductance of RRAM 111, 211 can be decreased with the application of current pulses, as shown in FIG. 17B. For example, with the configuration of FIG. 17A, V1 can initially be set at Vcc by switching Q to ground and Vcc can also initially be set at Vcc. When the driver 1702 changes state, V2 will switch from Vcc to ground, thereby causing the flow of current through the through the RRAM 111, 211 and capacitor 1701. This direction of current flow can cause an increase in the resistance of the RRAM 111, 211 and can pull V2 back up to Vcc. When V2 changes state from ground back to Vcc but the PFET 1705 is still turned on, node V1 will be clamped to Vcc and current flow through the RRAM 111, 211 in the opposite direction is prevented. Thus, the PFET 1705 can be used to prevent any decrease in the resistance of the RRAM 111. 211. Now, the resistance of the RRAM 111, 211 can be adjusted upward in a unidirectional fashion (i.e., increased) as a function of the number and magnitude of pulses. That is, the resistance of the RRAM 111, 211 can be increased with each pulse and the per pulse rate of increase will depend upon the magnitude of the pulses. In order words, with this configuration, the conductance of the RRAM 111, 211 can be decreased with each pulse and the per pulse rate of increase will depend on the magnitude of the pulses.

Figure 18A:
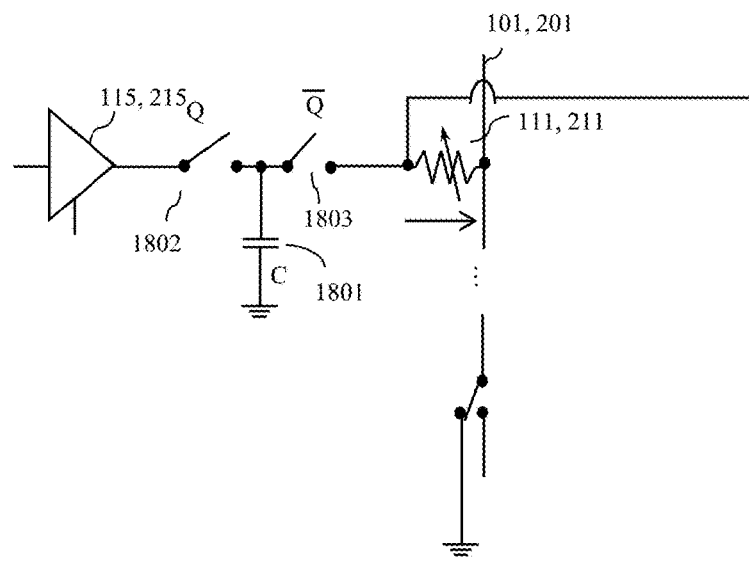
Figure 18B:
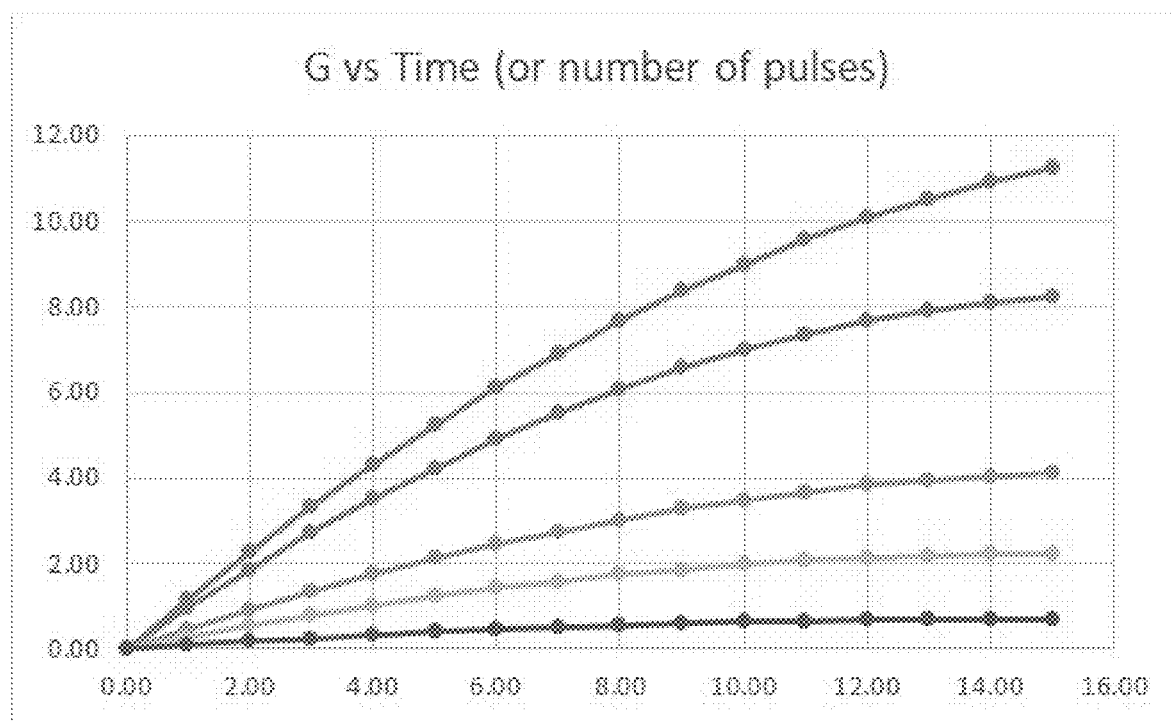

For example, FIG. 18A is a schematic diagram illustrating additional components that could be employed to implement one writing scheme in which conductance is increased using a capacitor reservoir for generating the pulsed current. Specifically, a pair of switches 1802 and 1803 (e.g., NFET switches), which are controlled by control signals Q and Qbar, respectively, can be series-connected between the output of the amplifier 115, 215 and one terminal of the RRAM 111, 211 and the opposite terminal can be connected to ground (e.g., via another switch). Additionally, a reservoir capacitor 1801 can be connected between an intermediate node (which is at the interface between the switches 1802-1803) and ground such that it is connected in parallel with the RRAM 111, 211. The max voltage on the RRAM 111, 211 can be controlled to deliver "programmable" amounts of charge and peak current thereto. The capacitance (C) of the capacitor 1801 can be varied for programmable charge packets. Vcc can also be varied for a programmable peak current and programmable charge packets. The current pulses into the RRAM 111, 211 will be proportional to Vcc, which can be adjusted to a lower value over time. The reservoir capacitor 1801 will limit the total amount of current flow into RRAM 111, 211 for any given pulse. With this configuration, conductance of RRAM 111, 211 can be increased with the application of current pulses, as shown in FIG. 18B. For example, with the configuration of FIG. 18A, C of the capacitor 1801 can initially be charged to Vcc, Q can be high and Qbar can be low. Thus, the voltage across the RRAM can be at ground because the switch 1803 is open. Q can then go low and Qbar can go high such that the capacitor 1801 is disconnected from Vcc and instead connected to the RRAM 111, 211 thereby causing current to flow from the capacitor 1801 through the RRAM 111, 211 to ground. This direction of current flow can cause the resistance of RRAM 111, 211 to be reduced. The cycle can be repeated. That is, Q can go high and Qbar can go low, disconnecting the capacitor 1801 from the RRAM 111, 211 and connecting it to Vcc for charging and so on. The more times the cycle is repeated, the more the resistance of the RRAM is reduced (i.e., the conductance of the RRAM 111, 211 is increased).

Figure 19A:
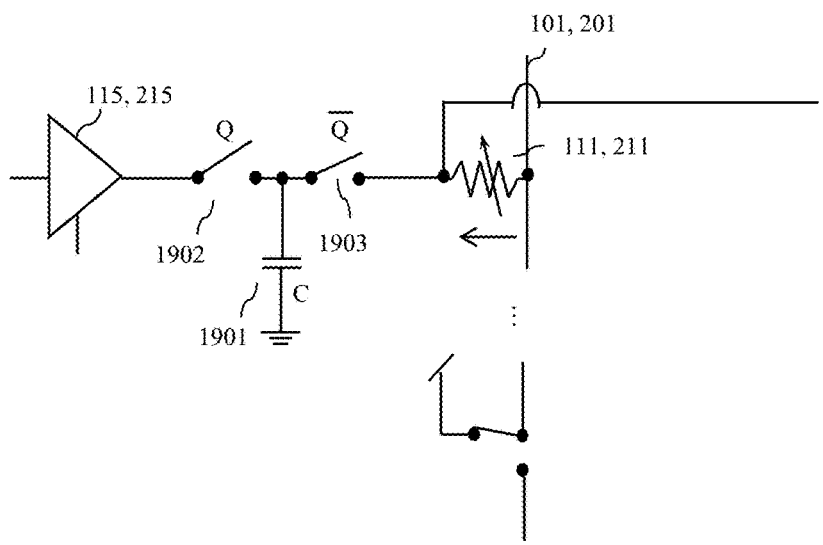
Figure 19B:
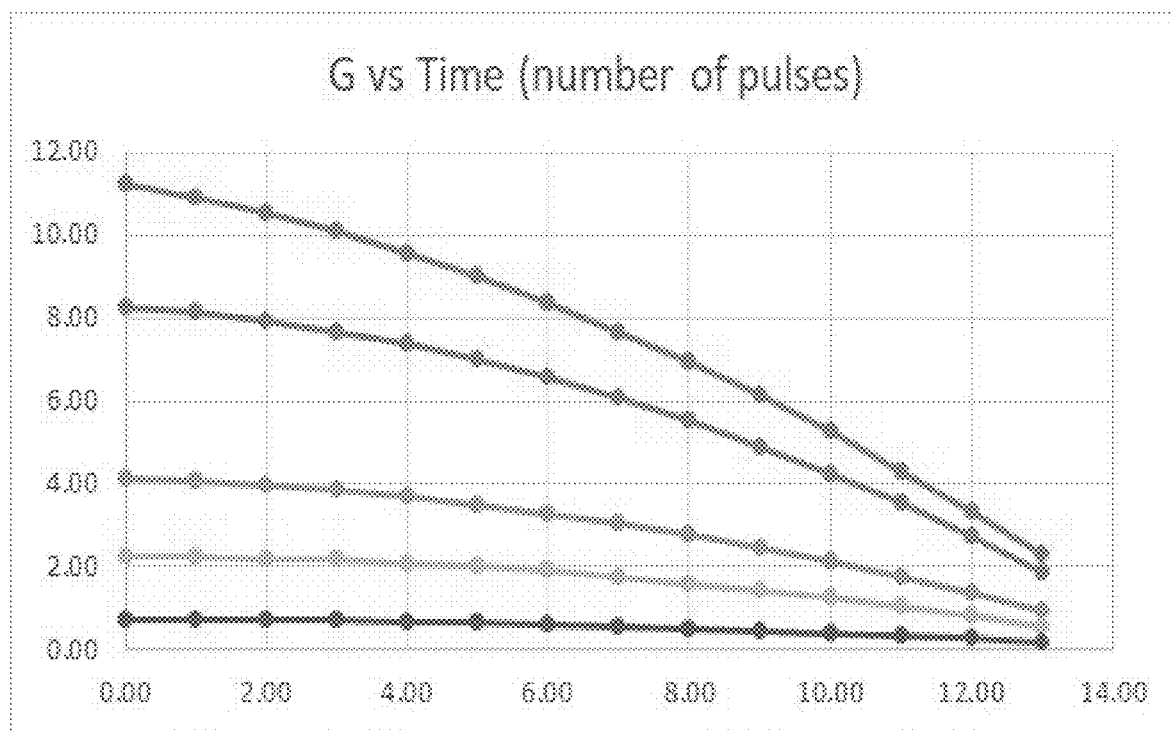

For example, FIG. 19A is a schematic diagram illustrating additional components that could be employed to implement one writing scheme in which conductance is decreased using a capacitor reservoir for generating the pulsed current. Specifically, a pair of switches 1902 and 1903 (e.g., NFET switches), which are controlled by control signals Q and Qbar, respectively, can be series-connected between the output of the amplifier 115, 215 and one terminal of the RRAM 111, 211 and the opposite terminal can be connected to Vcc (e.g., via another switch). Additionally, a reservoir capacitor 1901 can be connected between an intermediate node (which is at the interface between the switches 1902-1903) and ground such that it is connected in parallel with the RRAM 111, 211. The max voltage on the RRAM 111, 211 can be controlled to deliver "programmable" amounts of charge and peak current thereto. The capacitance (C) of the capacitor 1901 can be varied for programmable charge packets. Vcc can also be varied for a programmable peak current and programmable charge packets. The current pulses into the RRAM 111, 211 will be proportional to Vcc, which can be adjusted to a lower value over time. The reservoir capacitor 1901 will limit the total amount of current flow into RRAM 111, 211 for any given pulse. With this configuration, conductance of RRAM 111, 211 can be decreased with the application of current pulses, as shown in FIG. 19B. For example, with the configuration of FIG. 19A, C of the capacitor 1901 can initially be charged to Vee (i.e., a low voltage), Q is high and Qbar is low such that the switch 1903 is open. Thus, the voltage across the RRAM is Vcc. Q can then go low and Qbar can go high such that the capacitor 1901 is disconnected from Vee and instead connected to the RRAM 111, 211, thereby causing current to flow from Vcc through the RRAM 111, 211 to the capacitor 1901 (which is charged to Vee). This direction of current flow can cause the resistance of RRAM 111, 211 to be increased. The cycle can be repeated. That is, Q can go high and Qbar can go low, disconnecting the capacitor 1901 from the RRAM 111, 211 and connecting it to Vee for charging and so on. The more times the cycle is repeated, the more the resistance of the RRAM is increased (i.e., the conductance of the RRAM 111, 211 is decreased).

Figure 20:
FIG. 20 is a schematic diagram illustrating current reversal switches that could be incorporated into the disclosed structure.
Figure 21:
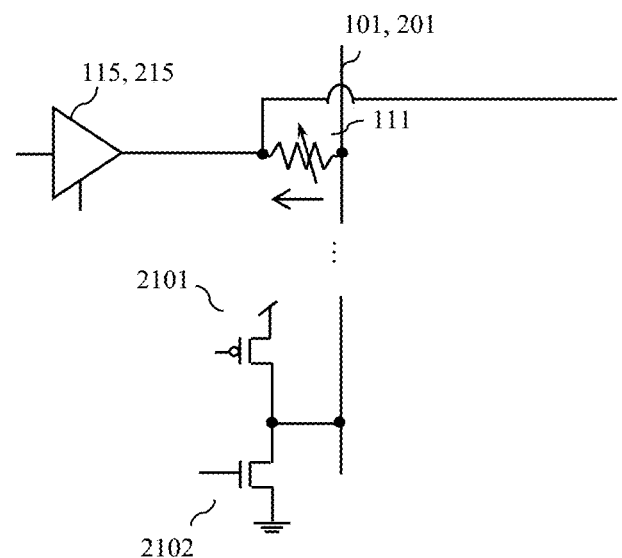
FIG. 21 is a schematic diagram illustrating additional components that could be incorporated the disclosed structure to implement both a writing and an erasing scheme.

It should be noted that additional components can be employed in the structure 100, 200 to facilitate reversing the programming of any RRAM. For example, as illustrated in FIG. 20, each RRAM can have an asymmetric physical structure with different top and bottom electrodes (as indicated by the dot on one terminal) and these terminals can be selectively connected by switches to different ones of the same two nodes (e.g., node $V_A$ and node $V_B$). If the process flow used to increase the conductance has "overshot" the target conductance, then the direction of current flow can be switched by switching the node connections of the RRAM terminals. In any of the programming structures shown in FIGS. 9-19A described above switches can be placed at the different terminals to allow for the reversal of current flow, as illustrated in FIG. 20. Additional components can also be employed in the structure 100, 200 to facilitate erasing prior programming of each programmable resistor 111-112 in each dual resistor memory element 110. For example, FIG. 21 is a schematic diagram illustrating additional components that could be employed to implement both a writing and an erasing scheme. Referring to FIG. 21 in combination with any of FIGS. 1 and 2, a weak PFET 2101 can have a source region connected to a positive supply voltage (e.g., Vcc) and a drain region connected to a programming node on a bitline 101, 201 (e.g., in the same manner as in FIG. 9 discussed above). An NFET 2102 can further be connected in series between the same programming node and ground. During a write mode, the feedback buffer circuit connected to the bitline can be switched off, the NFET 2102 can be off, and the output of the amplifier 115, 215 can be switched to a low value. The gate of the PFET 2101 can be controlled by a write control signal that is lowered (e.g., by a control signal from a controller, not shown) in small increments to increase the conductivity of the PFET 2101. As the PFET 2101 gradually turns on, there will be a corresponding increase in programming current through the RRAM 111, 211, thereby increasing the conductivity of the PFET 2101. The PFET 2101 can subsequently be turned off and the feedback buffer circuit connected to the bitline 101, 201 can be turned back on, again biasing the bitline 101, 201 to Vvg. During the erase mode, the output of the amplifier 115, 215 can be switched to high and the NFET 2102 can be turned on. Such an erase process, like the write process, can be performed on one programmable resistor at a time. Alternatively, all programmable resistors in a memory bank, all programmable resistors in a column of memory banks or all programmable resistors in the memory bank array can be concurrently erased.

In the disclosed structures, the memory elements are described above and shown in the figures as being either single resistor memory elements or dual resistor memory elements. However, it should be understood that the figures and description thereof are not intended to be limiting. Alternatively, the disclosed structures could include memory elements with more than two programmable resistors. In this case, each memory bank would have a corresponding number of bitlines with feedback buffer circuits and each column of memory banks would have additional circuitry (e.g., addition or subtraction circuitry) to combine the current outputs from all bitlines as appropriate depending upon whether the values stored correspond to positive or negative weight values.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an array of memory banks arranged in rows and columns, wherein each memory bank comprises:
input nodes;
a bitline;
memory elements, wherein each memory element comprises a programmable resistor connected between a corresponding input node and the bitline; and
a feedback buffer circuit connected to the bitline, and
wherein each row of the memory banks comprises an initial memory bank comprising: track-and-hold devices connected to the input nodes; and amplifiers connected between the input nodes and the memory elements.

2. The structure of claim 1,
wherein each track-and-hold device comprises:
an analog voltage terminal;
a track node connected to an input node;
a switch connected between the analog voltage terminal and the track node; and
a capacitor connected between the track node and ground,
wherein, in a track mode, the switch connects the analog voltage terminal to the track node and the capacitor stores a stored voltage equal to an analog voltage at the analog voltage terminal, and
wherein, in a hold mode, the switch disconnects the analog voltage terminal from the track node.

3. The structure of claim 2, wherein each amplifier receives the stored voltage as an input voltage, adds a virtual ground voltage to the input voltage, and outputs a level shifted input voltage equal to a sum of the input voltage and the virtual ground voltage.

4. The structure of claim 1, wherein, within each memory bank, the feedback buffer circuit biases the bitline to a virtual ground voltage.

5. A structure comprising:
an array of memory banks arranged in rows and columns, wherein each memory bank comprises:
input nodes;
an output node;
a bitline comprising a bias node;
memory elements, wherein each memory element comprises a programmable resistor connected between a corresponding input node and the bitline; and
a feedback buffer circuit connected to the bias node and the output node, and
wherein each row of the memory banks comprises an initial memory bank comprising: track-and-hold devices connected to the input nodes; and amplifiers connected between the input nodes and the memory elements.

6. The structure of claim 5,
wherein each track-and-hold device comprises:
an analog voltage terminal;
a track node connected to an input node;
a switch connected between the analog voltage terminal and the track node; and a capacitor connected between the track node and ground, wherein, in a track mode, the switch connects the analog voltage terminal to the track node and the capacitor stores a stored voltage equal to an analog voltage at the analog voltage terminal, and wherein, in a hold mode, the switch disconnects the analog voltage terminal from the track node.

7. The structure of claim 6, wherein each amplifier receives the stored voltage as an input voltage, adds a virtual ground voltage to the input voltage, and outputs a level shifted input voltage equal to a sum of the input voltage and the virtual ground voltage.

8. The structure of claim 7, further comprising:
sets of row interconnect lines interconnecting adjacent memory banks within each row and communicating level shifted input voltages from memory bank to memory bank within the rows; and
voltage buffers integrated into at least some of the memory banks to buffer the level shifted input voltages.

9. The structure of claim 6,
wherein, within each memory bank, the feedback buffer circuit biases the bias node to a virtual ground voltage and output, at the output node of the memory bank, a buffered bank-specific output current dependent on a sum of all output currents from all programmable resistors of the memory elements in the memory bank,
wherein the structure further comprises column interconnect lines for the columns, respectively, and
wherein each column interconnect line for each column is connected to all output nodes of all memory banks in the column and receives and sums all buffered bank-specific output currents from all memory banks in the column.

10. The structure of claim 9, further comprising current-to-voltage converters for the columns, respectively, wherein each current-to-voltage converter for each column is connected to the column interconnect line for the column, receives, from the column interconnect line for the column, a column-specific output current equal to a sum of the buffered bank-specific output currents from the memory banks in the column, and outputs a column-specific analog output voltage based on a the column-specific output current.

11. The structure of claim 10, wherein the column-specific analog output voltage represents a solution for a dot product computation.

12. The structure of claim 6, wherein, within each memory element, the programmable resistor is programmable to any of multiple different resistance states to store a weight value as a function of a programmed resistance state.

13. The structure of claim 6, wherein the programmable resistor of each memory element comprises any of a resistive random access memory-type resistor, a phase change memory-type resistor, and a magnetic tunnel junction-type resistor.

14. A structure comprising:
an array of memory banks arranged in rows and columns, wherein each memory bank comprises:
input nodes;
a first output node;
a second output node;
a first bitline comprising a first bias node;
a second bitline comprising a second bias node;
dual resistor memory elements, wherein each dual resistor memory element comprises:
a first programmable resistor connected between a corresponding input node and the first bitline; and
a second programmable resistor connected between the corresponding input node and the second bitline;
a first feedback buffer circuit connected to the first bias node and the first output node; and
a second feedback buffer circuit connected to the second bias node and the second output node, and
wherein each row of the memory banks comprises an initial memory bank comprising: track-and-hold devices connected to the input nodes; and amplifiers connected between the input nodes and the memory elements.

15. The structure of claim 14,
wherein each track-and-hold device comprises:
an analog voltage terminal;
a track node connected to an input node;
a switch connected between the analog voltage terminal and the track node; and
a capacitor connected between the track node and ground,
wherein, in a track mode, the switch connects the analog voltage terminal to the track node and the capacitor stores a stored voltage equal to an analog voltage at the analog voltage terminal, and
wherein, in a hold mode, the switch disconnects the analog voltage terminal from the track node.

16. The structure of claim 15, wherein each amplifier receives the stored voltage as an input voltage, adds a virtual ground voltage to the input voltage, and outputs a level shifted input voltage equal to a sum of the input voltage and the virtual ground voltage.

17. The structure of claim 16, further comprising:
sets of row interconnect lines interconnecting adjacent memory banks within each row and communicating level shifted input voltages from memory bank to memory bank within the rows; and
voltage buffers integrated into at least some of the memory banks to buffer the level shifted input voltages.

18. The structure of claim 14,
wherein, within each memory bank, the first feedback buffer circuit biases the first bias node to a virtual ground voltage and outputs, at the first output node of the memory bank, a buffered bank-specific first output current dependent on a sum of all first output currents from all first programmable resistors of the dual resistor memory elements in the memory bank and the second feedback buffer circuit biases the second bias node to the virtual ground voltage and outputs, at the second output node of the memory bank, a buffered bank-specific second output current dependent on sum of all second output currents from all second programmable resistors of the dual resistor memory elements in the memory bank,
wherein the structure further comprises pairs of column interconnect lines for the columns, respectively, and
wherein each pair of column interconnect lines for each column comprises:
a first column interconnect line connected to all first output nodes of all memory banks in the column, wherein the first column interconnect line receives and sums all buffered bank-specific first output currents from all memory banks in the column; and a second column interconnect line connected to all second output nodes of all memory banks in the column, wherein the second column interconnect line receives and sums all buffered bank-specific second output currents from all memory banks in the column.

19. The structure of claim 18, further comprising subtractors for the columns, respectively,
wherein each subtractor for each column is connected to the pair of the column interconnect lines for the column, receives, from the first column interconnect line of the pair, a column-specific first output current equal to a sum of the buffered bank-specific first output currents from the memory banks in the column, receives, from the second column interconnect line of the pair, a column-specific second output current equal to a sum of the buffered bank-specific second output currents from the memory banks in the column, and outputs a column-specific analog output parameter based on a difference between the column-specific first output current and the column-specific second output current, and
wherein the column-specific analog output parameter comprises a column-specific analog output voltage representing a solution for a dot product computation.

20. The structure of claim 14, wherein, within each dual resistor memory element, the first programmable resistor and the second programmable resistor are programmable to any of multiple different resistance states to store a total weight value as a function of a programmed first resistance state of the first programmable resistor representing a positive weight value and a programmed second resistance state of the second programmable resistor representing a negative weight value.

* * * * *